US005546080A

United States Patent [19]
Langdon, Jr. et al.

[11] Patent Number: 5,546,080
[45] Date of Patent: Aug. 13, 1996

[54] ORDER-PRESERVING, FAST-DECODING ARITHMETIC CODING ARITHMETIC CODING AND COMPRESSION METHOD AND APPARATUS

[75] Inventors: Glen G. Langdon, Jr., Aptos; Ahmad Zandi, Cupertino, both of Calif.

[73] Assignee: International Business Machines Corporation, Armonk, N.Y.

[21] Appl. No.: 176,636

[22] Filed: Jan. 3, 1994

[51] Int. Cl.$^6$ ............................................. H03M 7/30
[52] U.S. Cl. ............................................. 341/107; 341/51
[58] Field of Search ................................. 341/50, 59, 63, 341/107, 51

[56] References Cited

U.S. PATENT DOCUMENTS

| | | | |
|---|---|---|---|
| 3,883,847 | 5/1975 | Frank | 340/146.1 |
| 4,122,440 | 10/1978 | Langdon, Jr. et al. | 341/51 |
| 4,286,256 | 8/1981 | Langdon, Jr. et al. | 340/347 DD |
| 4,464,650 | 8/1984 | Eastman et al. | 340/344 DD |
| 4,488,143 | 12/1984 | Martin | 340/347 DD |
| 4,494,108 | 1/1985 | Langdon, Jr. et al. | 340/347 DD |
| 4,652,856 | 3/1987 | Mohiuddin et al. | 341/60 |
| 4,672,539 | 6/1987 | Goertzel | 364/300 |
| 4,891,643 | 1/1990 | Mitchell et al. | 341/107 |
| 4,905,297 | 2/1990 | Langdon, Jr. et al. | 382/56 |
| 4,929,946 | 5/1990 | O'Brien et al. | 341/87 |
| 4,989,000 | 1/1991 | Chevion et al. | 341/107 |
| 5,010,344 | 4/1991 | Nagy | 341/65 |
| 5,142,283 | 8/1992 | Chevion et al. | 341/107 |
| 5,418,532 | 5/1995 | Lei | 341/107 |

FOREIGN PATENT DOCUMENTS

350439A3  1/1990  European Pat. Off. .

OTHER PUBLICATIONS

C. B. Jones, An Efficient Coding System for Long Source Sequences, IEEE Transactions on Information Theory, vol. IT–27, No. 3, pp. 280–291, May 1981.

J. Rissanen and K. M. Mohiuddin, A Multipiliction–Free Multialphabet Arithmetic Code, IEEE Transactions on Communications, vol. 37, No. 2 pp. 93–98, Feb. 1989.

E. N. Gilbert and E. F. Moore, Variable–Length Binary Encodings, BSTJ, vol. 38, pp. 933–967, 1959.

G. G. Langdon et al., A Simple General Binary Source Code, IEEE Trans, vol. IT–28, pp. 800–803, 1982.

G. G. Langdon, Augend–Based Arithmetic Codes and the Golomb Code, IBM Res. Rept. RJ7844, Nov. 1990.

J. Rissanen et al., Universal Modeling and Coding, IEEE Trans. on Information Theory, vol. IT–27, pp. 12–23, Jan. 1981.

Shannon, A Mathematical Theory of Communication, Bell Syst. Tech., Journal vol. 27, pp. 379–423 Jul. 1948.

(List continued on next page.)

Primary Examiner—Marc S. Hoff
Attorney, Agent, or Firm—James C. Pinter

[57] ABSTRACT

An efficient, fast-decoding, order-preserving, easily implementable, length-based (L-based) arithmetic coding method, apparatus, and manufacture for an m-ary alphabet {1, ..., i, ..., m} is provided. A coding method in accordance with the invention combines recursive division of intervals on a number line into sub-intervals whose lengths are proportional to symbol probability and which are ordered in lexical order with the constraint that probabilities be estimated as negative powers of two (½, ¼, ⅛, etc.). As a consequence, the advantageous preservation of lexical order and computational efficiency are both realized. Also, a coding system in accordance with the invention is simple to implement, and high speed operation is achieved, because shifts take the place of multiplications. A coding apparatus in accordance with the invention preferably includes either a single decoding table to achieve fast decoding, or two decoding tables to achieve fast decoding as well as order preservation. The decoding process can conveniently be performed by constructing a decoding table for the C register. The C register is initialized with the leading bits of the codestring. The decoded symbol is the symbol i, i being the greatest integer that makes the C-register value greater than or equal to P(i).

9 Claims, 11 Drawing Sheets

OTHER PUBLICATIONS

R. G. Gallager, Variations on A Theme by Huffman, IEEE Trans. Infor. Theory, vol. IT–26, pp. 668–674, Nov. 1978.

G. G. Langdon, An Introduction to Arithmetic Coding, IBm J. Res. Develop., vol. 28, No. 2, pp. 135–149, Mar. 1984.

P. G. Howard et al., Image and Text Compression, Kluwer Academic Publishers, Kluwer Inter. Series in Engn. & Computer Science, pp. 85–112, 1992.

G. G. Langdon, Jr. et al., Compression of Black–White Images with Arithmetic Coding, IEEE Transactions on Communications, vol. COM–29, No. 6, ISSN 0090–6778, pp. 858–867, Jun. 1981.

| Symbol i | Probability $P_i$ | Augend $G_i$ | Codelength $L_i$ |
|---|---|---|---|
| a | .001 | .000 | 3 |
| b | .01 | .001 | 2 |
| c | .001 | .011 | 3 |
| d | .1 | .1 | 1 |

*FIG. 4A*

| Index j | Decoded Symbol i | C-Register Value After Subtraction | Shift |
|---|---|---|---|
| .000 | a | .000 | 3 |
| .001 | b | .000 | 2 |
| .010 | b | .001 | 2 |
| .011 | c | .000 | 3 |
| .100 | d | .000 | 1 |
| .101 | d | .001 | 1 |
| .110 | d | .010 | 1 |
| .111 | d | .011 | 1 |

*FIG. 4B*

FIG. 7   A STRUCTURE FOR FIGURE 6

ORDER-PRESERVING, FAST-DECODING ARITHMETIC CODING ARITHMETIC CODING AND COMPRESSION METHOD AND APPARATUS

FIELD OF THE INVENTION

This invention relates generally to data storage and compression methods in computer systems, and more particularly, to fast-decoding arithmetic coders that can be easily implemented to approach theoretical limits of compression while preserving sort order in the compressed records.

DESCRIPTION OF THE PRIOR ART

Data compression coding refers to the process of transforming a stream or data to a "compressed" form (that is, a form including a smaller total number of bits), from which the original, or some approximation of it, can be reconstructed at a later time. Reversible or "lossless" data compression is achieved when compressed (or encoded) data can be subsequently decompressed (or decoded) to the original form. "Lossy" data compression allows the decompressed data to vary from the original on condition that the decompressed data preserves the essence of the original by satisfying some fidelity criterion. Although the cost of storage has declined rapidly, and continues to do so, use of effective data compression techniques will further reduce the required storage space while maintaining the desired performance. Furthermore, given communication bandwidth constraints, data in a compressed form can be expeditiously transmitted, providing a significant advantage in various information-intensive applications involving communication channels.

Two desirable properties of a data compression coding system or method are high compression efficiency and preservation of lexical ordering. However, these properties have tended to be mutually exclusive, or have required trade-offs. Much of the work that has been done in this field has pursued the goal of realizing both compression efficiency and lexical ordering.

The process of data compression can be split into two parts: modeling and coding. In the modeling task, symbols may appear in various contexts or conditions, and probabilities are assigned to the symbols of an alphabet according to the context or conditioning state. A model is therefore a collection of context-dependent probability distributions. The statistical model for the distributions is often based on an assumed histogram of relative frequencies.

In the coding tasks (including both the encoding and the decoding processes), these probabilities are translated to a sequence of bits and vice versa. See J. Rissanen and G. G. Langdon, "Universal Modeling and Coding," IEEE Transactions on Information Theory, Vol. IT-27, pp. 12–23, January 1981, incorporated herein by reference.

The relationship between probabilities and codes was first established in Shannon, "A Mathematical Theory of Communication," Bell Syst. Tech. Journal, Vol. 27, pp. 398–403, July 1948, where it is shown that a symbol which is expected to occur with a probability p is best represented in $-\log p$ bits, the base of the logarithm being 2. Hence, a symbol with a higher probability is coded in fewer bits, whereas a less probable symbol requires more bits for coding. The expected codelength is obtained by averaging the codelength over all possible symbols weighted by the probabilities of occurrence of the symbols. Shannon expressed this idea methematically in the expression $H = -\Sigma p_i \log p_i$. This is called the entropy of the probability distribution. The entropy of a coding scheme is zero if the probability of occurrence is unity for one symbol, and zero for all other symbols. The entropy is at a maximum if the probability of occurrence is equal for all symbols.

According to Shannon's coding theorem, entropy imposes a lower bound on compression. In other words, entropy establishes a minimum value for the mean number of bits per character required for the coded messages. For each given distribution, there exist techniques for the design of codes with which the limiting performance, the entropy, can be achieved to a desired accuracy. Among such high-compression-efficiency codes are the classical Huffman code and the more recent and flexible arithmetic coder. Other desirable properties of the data compression codes include preservation of lexical order, fast coding and decoding, and readiness for implementation, as discussed in detail below.

In a typical Huffman coding scheme, the symbols of an alphabet are associated with the leaves of a binary tree. Initially, the symbols are listed in the order of probabilities. The construction of the tree starts with choosing the two symbols having the lowest probabilities as the first pair of sibling nodes. An intermediate node as their parent is then generated; the branch from the parent node to one of the child nodes is labeled 1 while the other is labeled 0. The two lowest probabilities and the associated nodes are replaced by the parent node with the sum of the two probabilities. This process is recursively repeated until all the symbols in the alphabet are included in the process. The Huffman code is highly efficient in the sense that its performance is usually quite close to the theoretical lower bound of compression. In fact, that limit is achieved if the input probabilities are negative powers of 2. See R. G. Gallager, "Variations on a theme by Huffman," IEEE Trans. Inform. Theory, Vol. IT-26, pp. 668–674, Nov. 1978.

Notwithstanding its popularity, the Huffman coding is not ideal for adaptive modeling and coding, because a new set of codes must be computed whenever the statistical model, i.e., the probability distributions of the symbols, changes.

Another major drawback of the Huffman coding is that it does not preserve symbol ordering in the compressed records. Depending on factors such as the nature of the data to be coded, various ordering arrangements might be desirable to maintain. For instance, the data may be sorted according to a lexical order, based on an "alphabetical" of equivalent lexical order of the symbol set. Maintaining lexical ordering in the coded data can facilitate easy access and decoding of desired data items.

One approach to preserve the lexical ordering of records is to adopt the so-called alphabetical-order encoding, in which the source record order is preserved as tile numerical order of their binary codes. See, for example, E. N. Gilbert and E. F. Moore, "Variable-length binary encodings,", Bell System Technical J., Vol. 38, pp. 933–967, July 1959. For a given alphabet and a given probability distribution (the set of probability values assigned to each member of the alphabet), a code (or dictionary) of codewords is constructed, and the codewords are listed in the alphabetical order of the member's of the alphabet.

The Gilbert-Moore code has the prefix property, i.e., no codeword in the code is the prefix of another codeword in the same code, and retains the sort order of words composed of the symbols of tile alphabet. At decoding, tile prefix property guarantees the unequivocal decoding of the next encoded item as soon as the next codeword is seen. Unfortunately, for a given model, the preservation of sort order in a Gilbert-Moore code is done at the expense of compression efficiency. Thus, the Gilbert-Moore code is generally not as efficient as a Huffman code.

Relative to high speed decoding for Huffman codes, U.S. Pat. No. 3,883,847, issued to A. Frank and titled "Uniform Decoding of Minimum-Redundancy Codes," provides for using stored tables for one or two accesses to memory in order to decode quickly.

In contrast to the Huffman code, arithmetic coding can be applied to any model, including adaptive ones in which the probability distributions or code assignments for symbols may be updated as the string is being processed. A typical class of arithmetic codes are the probability-based, or product-based (i.e., multiplication is used) codes, called P-based arithmetic codes in G. G. Langdon, "An introduction to arithmetic coding," IBM J. Res. Develop., Vol. 28, No. 2, pp. 135–149, March 1984, which is incorporated herein by reference. A typical arithmetic coder divides a fixed interval on a number line into subintervals which correspond with respective symbols. Lexical order is preserved by arranging the subintervals on the number line in order corresponding with the lexical order of the symbols. The lengths of the subintervals are in proportion to the assumed or estimated probabilities (relative frequencies) of the corresponding symbols.

After the current interval is subdivided, the sub-interval corresponding to the actual symbol being encoded is selected as a new current interval.

This division and selection process involves calculation of coordinates of points on the number line in terms of the probabilities of the symbols, the interval length, and the interval endpoint coordinates. This division and selection process involves calculation of coordinates of points on the number line in terms of the probabilities of the symbols, the interval length, and the interval endpoint coordinates.

To encode a symbol string, the above process is done recursively for each successive symbol. Such a process of assignment and selection is repeated, each time using the sub-interval from the previous iteration as the starting interval for the next.

In the above-cited P-based arithmetic codes disclosed by Langdon, the recursive process of dividing a subinterval into another level of subintervals to encode each successive symbol involves cumulatively many multiplication steps. As a consequence, computational efficiency is desirable in the encoding process. An example is given below in some detail.

As noted in the Langdon reference cited above, during encoding and decoding, the subinterval associated with a given symbol can be identified by any one of three identification methods:

(IM1) Both end points ($C_{lo}$ to $C_{hi}$);

(IM2) the left end point $C_{lo}$ and the width of the subinterval A; and (IM3) the right end point $C_{hi}$ and the subinterval width A. The second identification method, IM2, is used in many P-based arithmetic codes.

An arithmetic coder often includes two registers, a C register and an A register. Unless otherwise specified, the following discussion will focus on the use of IM2 to to identify the subinterval, in which the C register identifies the left end point $C_{lo}$ of the subinterval corresponding to the incoming symbol, while the A register contains the subinterval width A corresponding to the probability of the incoming symbol.

FIG. 1 shows how an interval labeled A is subdivided among the four symbols w, x, y, and z of a 4-symbol alphabet. The A-reg value, i.e., the width of the current interval, is defined as the "codespace." The assumed probabilities of the symbols are respectively p(w), p(x), p(y) and p(z). The portion of the codespace assigned to the symbol y is the ratio of the new interval width (or the new codespace) to the current interval width (or the old codespace). In P-based codes, that ratio is proportional to p(y). The "breakpoints", the points which delimit the boundaries of the subintervals within the current interval, are also identified by their position relative to the left and the right end points.

The initial interval width is typically normalized to have $C_{lo}$ at 0.0 and $C_{hi}$ at 1.0. As an example, one can use fixed point arithmetic (e.g., with 32-bit registers) and treat the fixed-point register integer value $2^{15} = 32,768$ as value 1.0. Such a code works independently of the scale factor (e.g., 32,768) or or any constant added to the initial width or range, so long as the relation $C_{lo}+A=C_{hi}$ is satisfied as the interval of value A is further subdivided in the progressing encoding (or decoding) process.

To further illustrate the process, assume symbol y is encoded by subdividing the interval A into four subintervals for the four symbols w, x, y, and z, and specifying the subinterval for the symbol y in terms of endpoints or subinterval widths as per the three identification methods. Table I below shows the new descriptive values of the new interval in terms of the old (i.e., the current) interval for the three identification methods heretofore described.

TABLE I

| Method | Current Interval | New Sub-Interval for the Symbol y Given by Encoding Based on the Symbol Probability p(y) |
|---|---|---|
| IM1 | $C_{lo}$, $C_{hi}$ | $C_{lo} + A \cdot [p(w) + p(x)]$ $C_{hi} - A \cdot p(z)$ |
| IM2 | $C_{lo}$, A | $C_{lo} + A \cdot [p(w) + p(x)]$, $A \cdot p(y)$ |
| IM3 | $C_{hi}$, A | $C_{hi} - A \cdot p(z)$, $A \cdot p(y)$ |

Thus, in the encoding operation, the C-register and A-register values are recursively calculated according to a pair of recursive formulas involving multiplications, shifts and magnitude comparisons. The decoding operation recursively "undoes" the encoding recursions. A number of magnitude comparisons and multiplications are also involved in the decoding process. If the lexical ordering is maintained in the same manner as the symbol ordering, the sort order of compressed records will be preserved, because the symbols are mapped onto the number line such that the magnitude order corresponds to the lexical order at each recursion. This method advantageously preserves lexical ordering, and also achieves good compression efficiency. However, because of the calculations required, computational efficiency is poor, and implementation is difficult.

To further illustrate the arithmetic codes, consider the augend-based (or A-based) codes. The first such code appeared in G. G. Langdon and J. Rissanen, "A Simple General Binary Source Code," IEEE Trans, Vol. IT-28, pp. 800–803, 1982. For a general reference on the A-based codes, see also G. G. Langdon, "Augend-Based Arithmetic Codes and the Golomb Code," IBM Research Report RJ 7844, IBM Almaden Research Center, San Jose, Calif., November 1990. These papers are incorporated herein by reference.

In Langdon and Rissanen, the mutiplications involving the A-register value and the probability are replaced by an approximation to the product, except for the most probable symbol (MPS). These approximations eliminate the need for some of the calculations.

A second approach using A-based codes is found in K. Mohiuddin and J. Rissanen, "Multiplication-Free Multi-Alphabet Arithmetic Code," U.S. Pat. No. 4,652,856, issued Mar. 24, 1987, and J. Rissanen and K. Mohiuddin, "A Multiplication-Free Multialphabet Arithmetic Code," IEEE Trans. Comm., V. 37, pp. 93–98, Feb. 1989, both of which are incorporated herein by reference.

In the Rissanen-Mohiuddin paper, the symbols of the m-ary alphabet $\{1, \ldots, i, \ldots, m\}$ are first listed in an arithmetic-coding order of increasing probabilities, the rightmost symbol m in the ordering being the MPS. The A-register value (also designated A) in the Rissanen-Mohiuddin paper is constrained to the left-closed, right-open interval [0.75, 1.5) for particular reasons therein. Strict adherence to this interval would complicate the calculations. In reality, at the cost of two more complicated comparisons, the renormalization point could be a value U, so that the A register is in the range [U,2U). However, the renormalization point of A may conveniently be chosen to be 1.0, such that the A-register value is constrained to the range [1.0, 2.0).

Note that techniques that renormalize less often using method IM1 of Table 1 typically choose a range in which the high bound on the interval width is a multiple of $2^k$ times of the low bound, where K is an integer greater than 1, as long as the low bound provides sufficient precision to represent the smallest allowable probability, since the high bound has K more bits than the low bound. Note that if A is constrained to be 1.0, then this is an integer-length case: all coding probabilities are negative powers of 2 (½, 1/4, 1/8, etc.). The integer length arithmetic codes represent the special members of the L-based codes described in Langdon's "Introduction to Arithmetic Coding" that has no fractional lengths.

Referring to FIGS. 2A and 2B, the symbol y is the rightmost symbol, and IM2 is used to identify the intervals. The other symbols i are each represented by a "scaled-up" approximation to the value A.p(i), where A.p(i) is the code space that should be assigned to the symbol i for best coding efficiency. The approximation actually assigned to the symbol i is called the augend Ag(i) (alternatively designated $G_i$) and is given by the expression Ag(i)≅A.p(i).

FIG. 2A provides an example for a minimum codespace (that is, a minimum value of A) where A=1.0. The codespace assigned to the symbol y is "left over," i.e., the space remaining after codespace has been assigned to the other symbols. For a four-symbol alphabet consisting of the symbols w, x, y, and z, the left over codespace assigned to the symbol y is given by the expression A−[Ag(w)+Ag(x)+Ag(z)], and is not necessarily larger than the codespace assigned to another symbol having lesser probability. If the new current width A during encoding falls below 1.0, the interval may be rescaled (or renormalized) to a value between 1.0 and 2.0 by multiplying A by 2 and C by 2, until A≧1.0. Thus in FIG. 2B, a larger codespace for y is obtained, because A has been renormalized to a value between 1.0 and 2.0. It is noted, however, that placing the MPS at the rightmost location on the number line results in the loss of lexical ordering of the symbols.

The encoding of a symbol i in the '856 patent, where i=0, 1, ..., m−1 for the m-nary alphabet, involves a C register and an A register, which together identify the subinterval by the leftmost point ($C_{lo}$) and the subinterval width A. An addend value Ad(i) corresponding to the probability of the symbol i, p(i), is computed and stored in the A register. Also computed is the augend Ag(i) corresponding to the cumulative probability of less probable symbols in the aforementioned ordering, i.e., $$Ag(i) = \sum_{j=0}^{i-1} Ad(j).$$

At each cycle-time, arithmetic is performed at the C register, where the augend Ag(i) for the incoming symbol i is added to the working end of the current codestring. The working end is defined as the least significant bits corresponding to the same precision as the A register, as per Langdon, "Introduction to Arithmetic Coding."

The A register, on the other hand, takes on a new valise of Ad(i) corresponding to the symbol i, unless i is the MPS, in which case the current A-register value minus the augend value of the MPS becomes the new value of the A register. This new A-register value is renormalized and shifted by a proper amount. The C register must also undergo an identical number of renormalization shifts to the left, with bits of zero value entering from the right, to develop the codestring. The left-shifting bits out of the C register become the new codestring bits out of the encoder. In this way, the A register bits continue to correspond to the least significant bits of the C register.

The decoding process of the Mohiuddin-Rissanen technique avoids multiplication through the use of the augends as approximations of the products Ag(i)=A p(i). However, despite the reduced computation, this technique is nevertheless slow or complicated. For example, given an 8-bit alphabet containing 256 symbols, the decoder must find the symbol i such that Ag(i) is less than or equal to the C-register value and Ag(i+1) is greater than the C-register value. Thus, if the decoding must be accomplished in one cycle-time, the decoder must make 256 simultaneous comparisons between the augends and the value of the C register (e.g., by using 256 comparators.) Accordingly, implementation is difficult and complex.

SUMMARY OF THE INVENTION

It is therefore an object of the present invention to provide a highly efficient, order-preserving coding technique which achieves a combination of high encoding and decoding speed, high compression efficiency, preservation of lexical ordering, and simple implementation not obtainable from any conventional methods or systems.

The present invention comprises novel arithmetic coding methods and apparatuses that (1) achieve compression performance comparable to that of the aforementioned Mohiuddin-Rissanen technique; (2) preserve sort order in compressed and decompressed records; and (3) most importantly, provide fast decoding techniques for the recovery of the records. The present invention also works with the special A=1.0 case, called the integer-length case, with equal or better coding efficiency over the Gilbert and Moore alphabetic codes.

In accordance with the invention, the probabilities of the symbols of an m-ary alphabet are approximated to the nearest powers of ½, resulting in integer symbol codelengths. These codelengths are used in an integer-length arithmetic coder in a manner similar to the way augends are used in an A-based arithmetic coder.

Although the approximation results in a loss in coding efficiency, the loss is usually quite small, especially when the alphabet is so large that the probability of each symbol is small. In comparison to the prior-art restricted-length Huffman code, such an integer-length arithmetic coder is not only as efficient but also provides the advantage of sort-order preservation. A further advantage of the integer-length arithmetic coder is that its implementation is even simpler than that of the above A-based arithmetic coder.

In one particular embodiment of the invention, the integer-length arithmetic coder comprises a C register, an arithmetic-logic unit (ALU), a memory device containing a symbol codelength lookup table. An augend-based (A-based) arithmetic coder comprising a lookup table based on the assigned cumulative probabilities of the symbols of the m-ary alphabet (or augends Ag(i) or $G_i$) is constructed.

In the encoding process, an arithmetic and logic unit (ALU) constructs a codestring in a recursive fashion and stores the codestring in a C register. In the recursive decoding process, the ALU subtracts from the C register the largest augend in the codelength table that leaves a positive value in the C register, shifts the C-register value by a proper amount, and sends out the symbol corresponding to this largest augend as the decoded symbol.

The integer-length feature of the present invention is easier to implement than conventional arithmetic coders, partly because the A register corresponding to a conventional arithmetic coder is always 1.0, and hence is not required.

BRIEF DESCRIPTION OF THE DRAWINGS

FIG. 4A depicts an augend (AG(i) or $G_i$) table for a 4-symbol alphabet.

FIG. 4B depicts the inverse lookup table for the alphabet in FIG. 4A.

DETAILED DESCRIPTION OF THE PREFERRED EMBODIMENTS

While the present invention may be embodied in many forms, particular embodiments are disclosed with the understanding that the present disclosure is not intended to limit the invention to the embodiments hereinafter illustrated.

Integer-Length Coder

In accordance with the invention, an efficient, order-preserving, fast-decoding, easy-to-implement, integer-length arithmetic coder for a m-ary alphabet {1, ..., i, ..., m} is constructed.

First, the probabilities $p_i$ of the symbols of the alphabet (or more generally, "events" such as strings of symbols) are used as the basis for a set of codewords obtained by the well-known algorithm of Huffman, resulting in integer symbol codeword lengths $l_i$ measured in bits. The codeword length is more generally referred to as the self-information, as per Shannon's nomenclature. By definition, the coding probability $p_i$ is $2^{-l_i}$ for symbol i, and $l_i = -\log_2 p_i$.

Although the approximation of the symbol probabilities to negative powers of 2 results in a loss in coding efficiency unless the probabilities of all symbols and events actually are negative powers of 2, the loss is quite small when the probability of the most probable symbol is relatively small, as is the case when the alphabet is large. Compared to a prior-art sort-order-preserving prefix code such as the Gilbert-Moore code, an arithmetic cooler based on integer codelengths in the present invention is as efficient as any prefix Huffman code, yet still provides the advantage of sort-order preservation. Thus a deficiency of the Gilbert-Moore code is overcome.

Furthermore, as will become obvious below, the use of integer codelengths makes it possible to use shifts in lieu of any multiplications in the recursions involving the C register. This results in advantageously simple implementation, relative to arithmetic codes that are not integer length, in more ways than simply avoiding multiplication.

Figure 3:
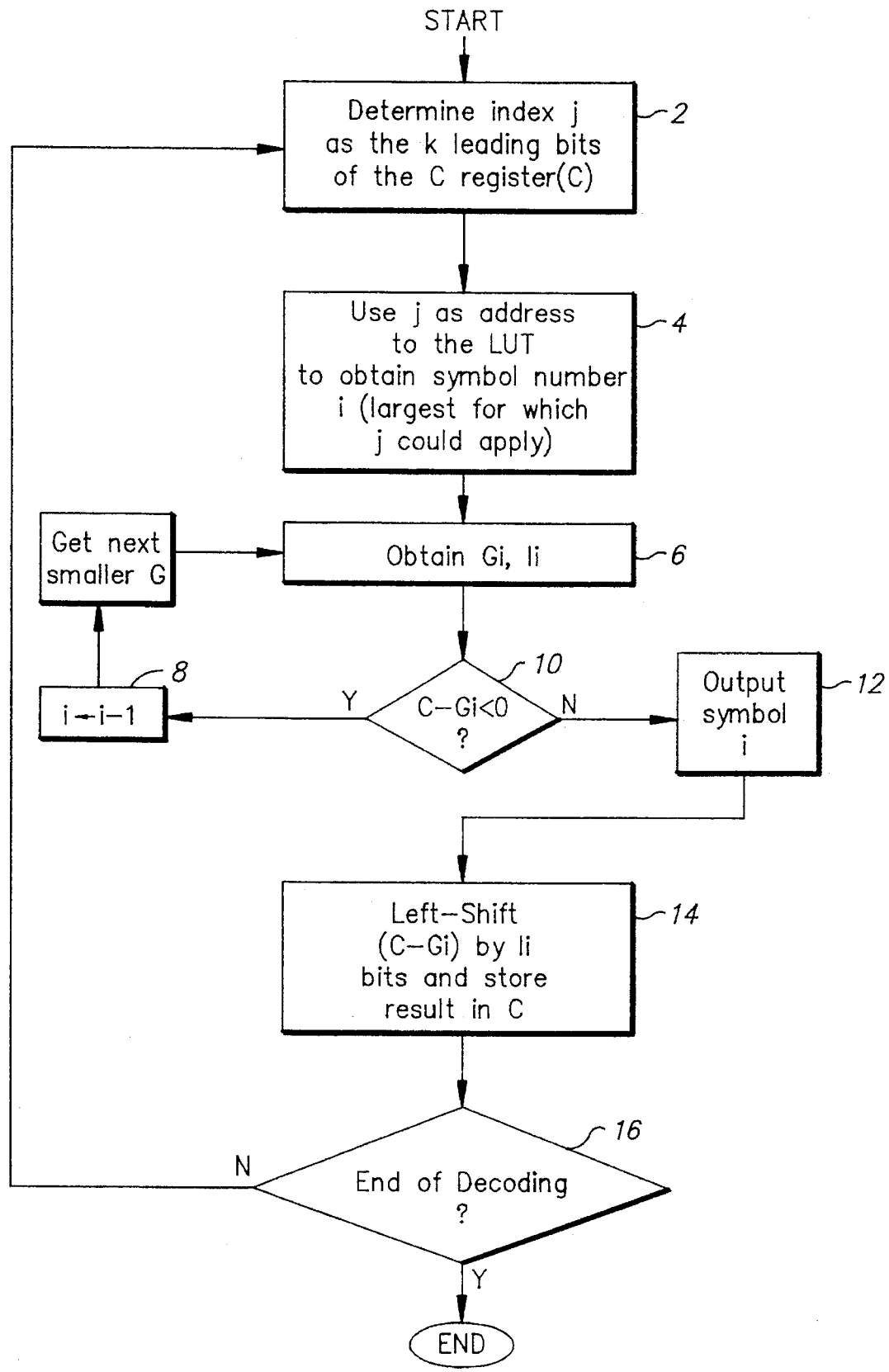
FIG. 3 depicts a flow chart for the decoding process of an integer-length arithmetic coder.

Referring now to FIG. 3, the decoding process according to the invention proceeds as follows. A string to be decoded was encoded from a symbol string in a manner essentially similar to those involved in the prior-art L-based arithmetic coding methods. Thus, the symbols (or events) are listed in a table of probabilities in lexical order. The cumulative probabilities are used as the augends. In accordance with the integer-length aspect of the invention, the coding probability $p_i$ of each symbol is a negative power of 2, so the binary-valued fractional probabilities or addends are in the form 0.00 . . . 01, that is, a binary point followed by no, one, or more than one zeroes and then a single one. A column of augends is appended to the above-identified symbol table, in which the augend $G_i$ is given by $$\sum_{j}^{i-1} p_j.$$

An example of the augend table for a 4-symbol alphabet is depicted in FIG. 4A for an exemplary four-symbol alphabet. The table is accessed by providing an index value corresponding with one of the symbols of the alphabet. For each index value, the symbol, its probability $p_i$, the augend $G_i$, and a codelength $l_i$ are provided. The probability is shown for descriptive purposes, since the length implies the probability for the integer-length case.

To encode a symbol i, the encoder simply adds $G_i$ to the working end of the codestring C, which is located in the C register, and left-shifts out the C-register value by $l_i$ bits. The encoding operation thus requires no multiplication steps. In addition, the code strings representing the strings of symbols are in the same sort order after the encoding process as were the symbol strings prior to encoding.

In the case of integer-length arithmetic codes, the decoder does not need the units position of the C register. In the general case, the encoder must handle the so-called "carry-over" problem described in Langdon, "Introduction to Arithmetic Coding." In some codes, the decoder side must make adjustments to the incoming codestring and/or the C register before preceeding with the decoding of the next symbol. For the embodiment of a decoder, we assume the A-register size varies from 1.00 . . . 0 to 1.11 . . . 1, where L fractional bits are involved. That is, if L=4, then we assume the normalized A register can store values from 1.0000 to 1.1111. When ready to decode, we assume the C register can hold values from 1.0000 to 1.1111 when L=4.

The decoding process is conveniently performed using an inverse lookup table for the C register. For the present example, FIG. 4B shows an inverse lookup table which corresponds with the lookup table of FIG. 4A.

Consider an unknown symbol i which is to be decoded. Referring to the flowchart of FIG. 3, in step 2 we assume symbols encoded prior to i have already been decoded, and their corresponding augends have been subtracted from the C register and their corresponding relative shifts properly taken into account. These operations have resulted in a current codestring C whose largest summand is due to the current symbol i to be decoded. That C register codestring is referred to in step 2 of FIG. 3.

The inverse table shown in FIG. 4B is constructed from the augend table of FIG. 4A such that the current C-register value C can be used as an index, or memory address, for decoding the proper symbol. The binary point for J is not needed for the embodiment where j is an address or offset to a base address. For each possible index value, the appropriate decoded symbol is given, along with a C register value after subtraction of the augend from the current C register value, and a shift amount (or count). The addresses to the lookup table may conveniently run from 0 to the largest value permitted by the C-register, based on the number of index bits. The number of bits in the index expressed as a binary number will be L+1, where L is the largest codelength $l_i$ for any of the symbols.

The decoding may be performed in a straightforward way by referring to the inverse lookup table. An index j is obtained from the most significant bits of the codestring C (step 2) and sent as an address value to the lookup table (LUT) in step 4. Any index j that is greater than or equal to an augend $G_i$ for the symbol i, but less than $G_{i+1}$ for a next symbol i+1, will point to an entry in the inverse table of FIG. 4B which contains the symbol i as the decoded symbol.

If there is a single augend corresponding to the index value (step 6), then it has been determined that symbol i is the next symbol decoded from the codestring (step 8). However, there may be more than one index value for a given symbol. For instance, the symbol b, which has an augend 0.001 in the FIG. 4A table, is represented by two entries in the FIG. 4B table. The next symbol, c, has an augend value 0.011, so b is represented by the second and third entries in the FIG. 4B table. This is because their index values, 0.001 and 0.010, are greater than or equal to b's augend value 0.001, but less than c's augend value 0.011. Thus, in an iterative process, it is tested whether the difference between the codestring and the augend is negative (step 10), and if so, and the index is decremented (step 8), until an index is found which satisfies the test of step 10. The symbol for that index is determined to be the next symbol of the string.

The augend corresponding to the decoded symbol is then subtracted from the C register, and relative shifts are made based on the shift count (step 14). The new C-register value provides the index to the lookup table for the decoding of the next symbol, unless decoding has been completed (step 16).

Figure 5A:
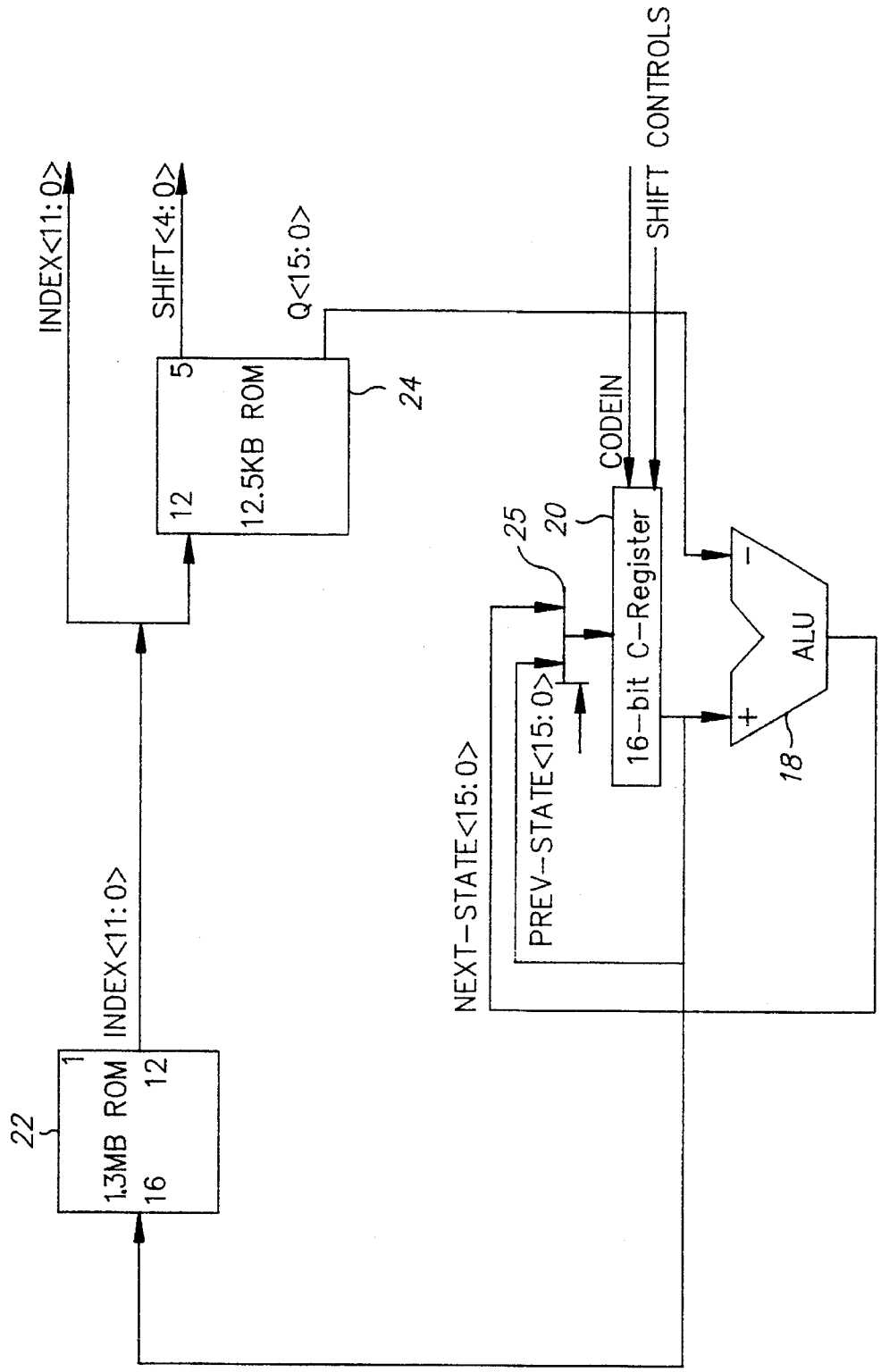
FIG. 5A depicts a decoding apparatus according to a first embodiment of the invention.

An apparatus which conveniently performs the process in FIG. 3 is depicted in FIG. 5A. The apparatus, which can be implemented as a general purpose processor suitably programmed, includes an arithmetic-logic unit (ALU) 18, a C register 20 which receives a serial codestream, and memory devices 22 and 24 containing the tables of FIGS. 4A and 4B.

FIG. 5A depicts the case where the full value of the C register 20 is employed to address the LUT (ROM) 22, and the decoded symbol INDEX is obtained directly. Here, the index accesses a smaller, secondary LUT 24, in lieu of increasing the width of the primary memory to accommodate the values of the length (shift) and augend (Q). An alternative embodiment, in which such an increased-width memory 36 is used in place of the memories 22 and 24, is given in FIG. 5C. Although the memories 22 and 24 of FIG. 5A are shown as read-only (ROM), they may be implemented in RAM or any other suitable addressable memory. The use of the NEXT_STATE information, stored in the memory 36 and bussed to the C register 20 over a bus 38, eliminates the need for the ALU 18 and related connections which appear in FIGS. 5A and 5B.

The multiplexer (mux or data selector) 25 represents one of the alternative ways to implement the loop 6, 10, 8 of FIG. 3. In FIG. 5A the mux 25 always places the ALU output 18 (next state) in the C register, because the output labeled INDEX of the LUT 22 is the decoded symbol, and the loop 6, 10, 8 is not required. The register 20, In addition to a parallel load from the mux 25, also has a left-shift capability. The left shift amount is prescribed by output value SHIFT from the secondate LUT 24, and the incoming replacement bits from the codestring appear on the input CODEIN. The shifting structure can be done serially bit-by-bit, in one cycle by a more complex barrel shifter, or using a combination of both techniques. Moreover, a barrel shifter could be placed between the ALU 18 and the register 20.

Figure 5B:
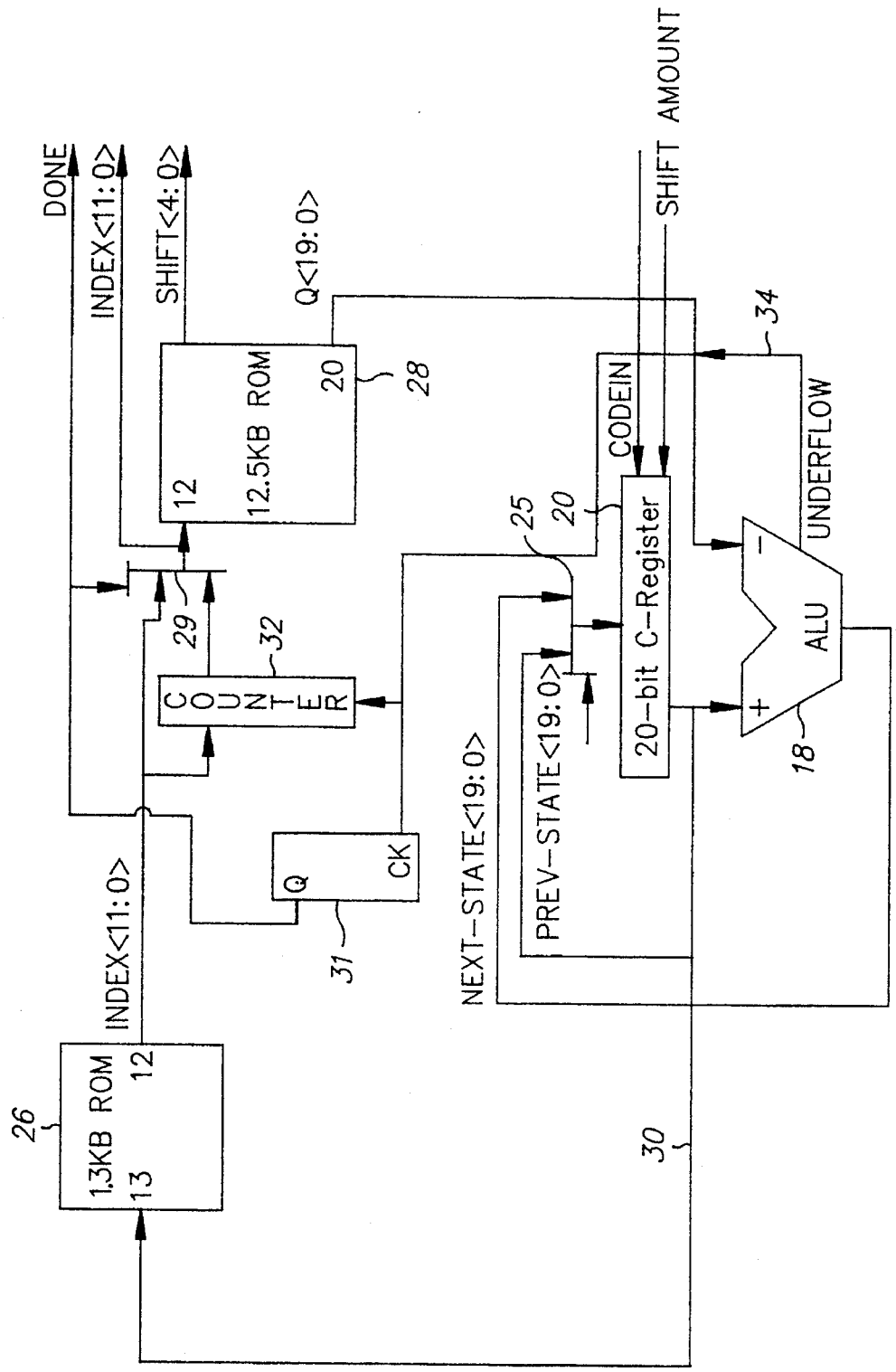
FIG. 5B depicts a decoding apparatus according to another embodiment of the invention.
Figure 5C:
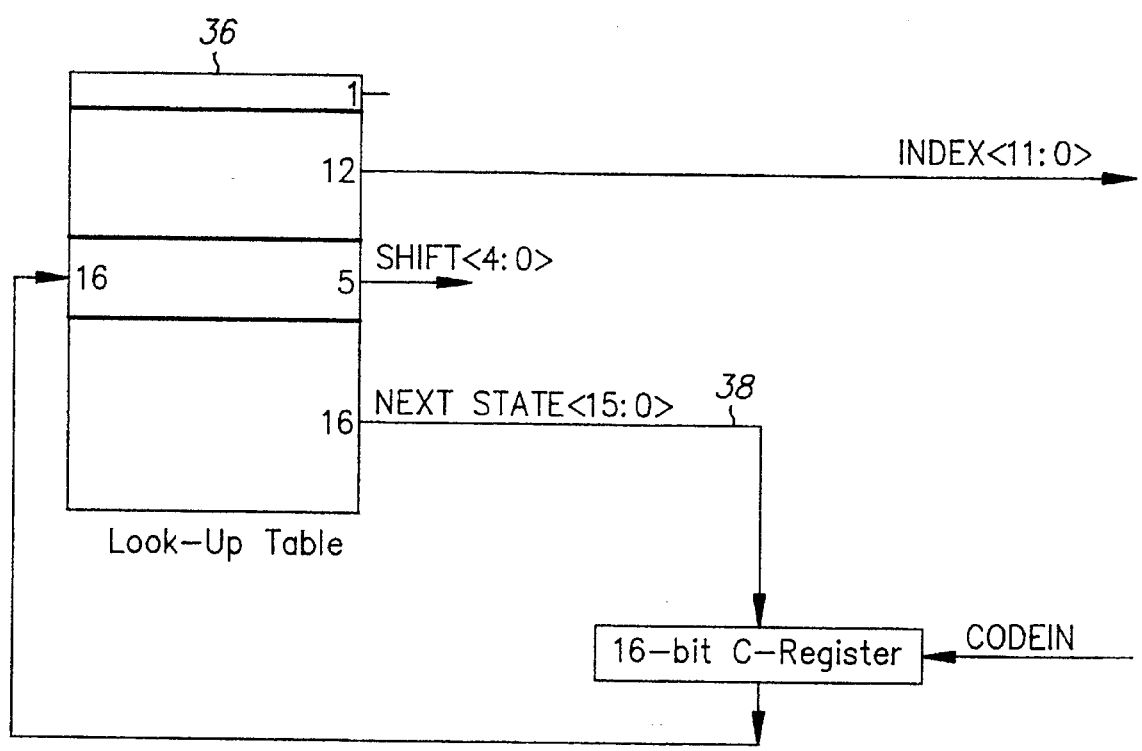
FIG. 5C depicts a decoding apparatus according to another embodiment of the invention.

FIG. 5B depicts an alternative embodiment in which the primary LUT address employs fewer than all of the bits of the C register, only the most significant bits, at a savings of memory capacity. In the embodiment of FIG. 5B, the loop 6, 10, 8 of FIG. 3 is and a previous state, designated PREV_STATE, may be selected by the mux 25 to be loaded into the C register. In some implementation technologies, an alternative to the mux 25 would be to inhibit clocking the C register if its contents were not to be changed (that is, when it is to be loaded with its current value).

FIG. 5B also includes a counter 32, which, in step 4 of FIG. 3, is loaded with the value i from the primary LUT 26. The counter 32 is a down-counter, which is originally loaded with the index value from the LUT 26, and which decrements the index in accordance with an UNDERFLOW signal from the ALU 18, to implement step 8 of the 6, 10, 8 loop. The signal 34, UNDERFLOW, represents the result of the comparison step 10. Underflow means the subtraction of the augend $G_i$ (denoted Q in FIG. 5B) from C resulted in a negative number. In many ALUs, a negative result is detected from the value of the sign bit signal indicating the minus sign value.

A multiplexer (mux) 29 receives as inputs the index directly from the LUT 26 and the down-counted index from the counter 32. The mux 29 selects between these indexes based on a control signal indicating whether there has been an UNDERFLOW in step 10. This control signal is preferably provided using a latch 31, which is set when an underflow appears, and is reset by a suitable controller (not shown) after the symbol has been decoded.

Instead of the L-bit indexes, k-bit indexes (k<L) may be used to construct an inverse lookup table. In this respect, an index having only k bits may sometimes be decoded to one of several symbols. Take the inverse table of FIG. 4B as an example. A two-bit index 00 would point to either a or b as the decoded symbol. This ambiguity may be resolved in several ways, for example, by using a second lookup table or a method of successive subtractions.

As a specific example, consider the alternative embodiment using k-bit indexes depicted in FIG. 5B. The apparatus in FIG. 5B comprises an ALU 18, a 16-bit C register 20, a 10-bit lookup table 26, and an augend table 28. For the decoding of a symbol, only the ten most significant bits of the C-register value is sent to the lookup table as the index j over a bus shown as 30.

Since this 10-bit index may correspond to several augends in the augend table, which all share the same 10 most significant bits, the proper augend pointing to the symbol being decoded may be determined in a recursive fashion. Referring again to FIG. 3, the largest of the several augends corresponding to the index j is subtracted from the C register. If the subtraction result is negative (i.e., causing underflow), the augend is too large for the symbol being decoded. The C-register value is restored by adding back the subtracted amount. This process is repeated with the next largest augend corresponding to the index j, until a positive subtraction result is obtained. The symbol i corresponding to the last subtracted augend is output as the decoded symbol. The subtraction result is left-shifted by an amount $l_i$ and stored in the C register, which in turn provides the index j for the next symbol to be decoded.

Augend-Based Coder

In accordance with another particular embodiment of the present invention, a highly efficient, order-preserving, fast-decoding, augend-based (A-based) arithmetic coder for a m-ary alphabet {1, . . . , i, . . . , m} is constructed. The encoding of a symbol i involves an arithmetic encoder comprising a C register and an A register.

Without any conditional scaling of the augend dependent upon an examination of the current A register value A, the augend Ag(i) corresponding to an incoming symbol i is added to the codestring C, which is kept in the C register. Ad(i) becomes the new value of the A register prior to renormalization, except where i equals m, (this is the last symbol of the symbol set) in which case the new value of the A register prior to renormalization is the current value A minus AdSum, AdSum being defined as the sum of Ad(i) for i=1 through (m−1).

Both registers are then renormalized and shifted by a proper amount $S_i$ depending on the symbol i and the internal state of the arithmetic encoder or decoder.

Consider the decoding process in the case of the '856 patent, where the m-th symbol, which occurs last in the ordering, is the most probable symbol MPS. The decoder undoes the encoded results to recover the encoded symbols. The augends Ag(i) are determined as usual (Ag(0)=0, etc.), with Ag(MPS)=AdSum, since MPS is the last symbol.

According to one aspect of the present invention, the decoder subtracts from the most significant portion of the codestring held in the C register the largest possible augend Ag(i) that the encoder could have added to the C-register while still maintaining a positive result from the subtraction. The addend Ad(i) corresponding to that augend becomes the new value in the A register prior to renormalization. The values in both A and C registers then undergo the proper renormalization left-shifting which took place in these two registers for the same symbol following its encoding.

The aforementioned largest possible augend needed by the decoder may conveniently be determined in a number of ways. For example, starting with Ad(i), each next Ad(i) may be recursively subtracted from the C register until the difference goes negative. Note that Ad(m) is calculated as A minus AdSum. The addend Ad(j) which causes the negative result is added back to the C register, and j becomes the decoded symbol.

In this context, fast decoding depends on the expeditious search and identification of the aforementioned largest possible augend. As a specific example, this task may be accomplished by first constructing a decoding or lookup table addressed by bits from the C register, where the C register has N bits of precision (hence the A register as N−1 fractional bits), and the decoding table has k address bits, where 0<k≦N.

Consider the specific case in which k=N=12. The decoding table has $2^{12}$=4096 entries :from '000'X (0) to 'FFF'X (4095). Corresponding to each 12-bit index j is a unique value i such that Ag(i)≦j<Ag(i+1). Since the MPS is last, the highest addresses decode to the MPS. The table entry for each j may suitably comprise several values such as i, Ad(i), Ag(i), and a shift amount S(i). To decode symbol i, the new A-register value $D_i$, and the new C-register value (the old value of the A register subtracting Ag(i)) can all be determined by a few simple table-lookup and arithmetic operations. The number of shifts for each Ad(i) can be calculated a priori, so the shift amount can also be retrieved from the decoding table.

Consider next the case where the number of address bits of the decoding table k<N, the number of bits of precision in the C register. There may be n augends (n≧2) satisfying j−1<Ag(i)<Ag(i+1)< . . . <Ag(i+n−1)≦j<Ag(i+n).

Using a secondary table, the entry in the aforementioned decoder table corresponding to the index j can be any one of i, i+1, . . . , i+n−1, the choice depending on the strategy to resolve the issue. For example, the first table entry could indicate a special table used for a secondary lookup employing the remaining N−k bits of the C register as the index.

In an alternative approach, special flags indicates the primary table entry as a multiple-augend situation and places the largest applicable augend value (i.e., Ag(i+n−1)) in the table. If subtracting Ag(i+n−1) from the C-register value results in a positive number, the corresponding symbol i+n−1 is the decoded symbol. In a third approach, let the table provide the index i as well as the value of the smallest Ag(i) that applies. The decoded symbol is determined by recursively adding addends to this smallest Ag(i), until the C-register value goes negative.

Figure 6:
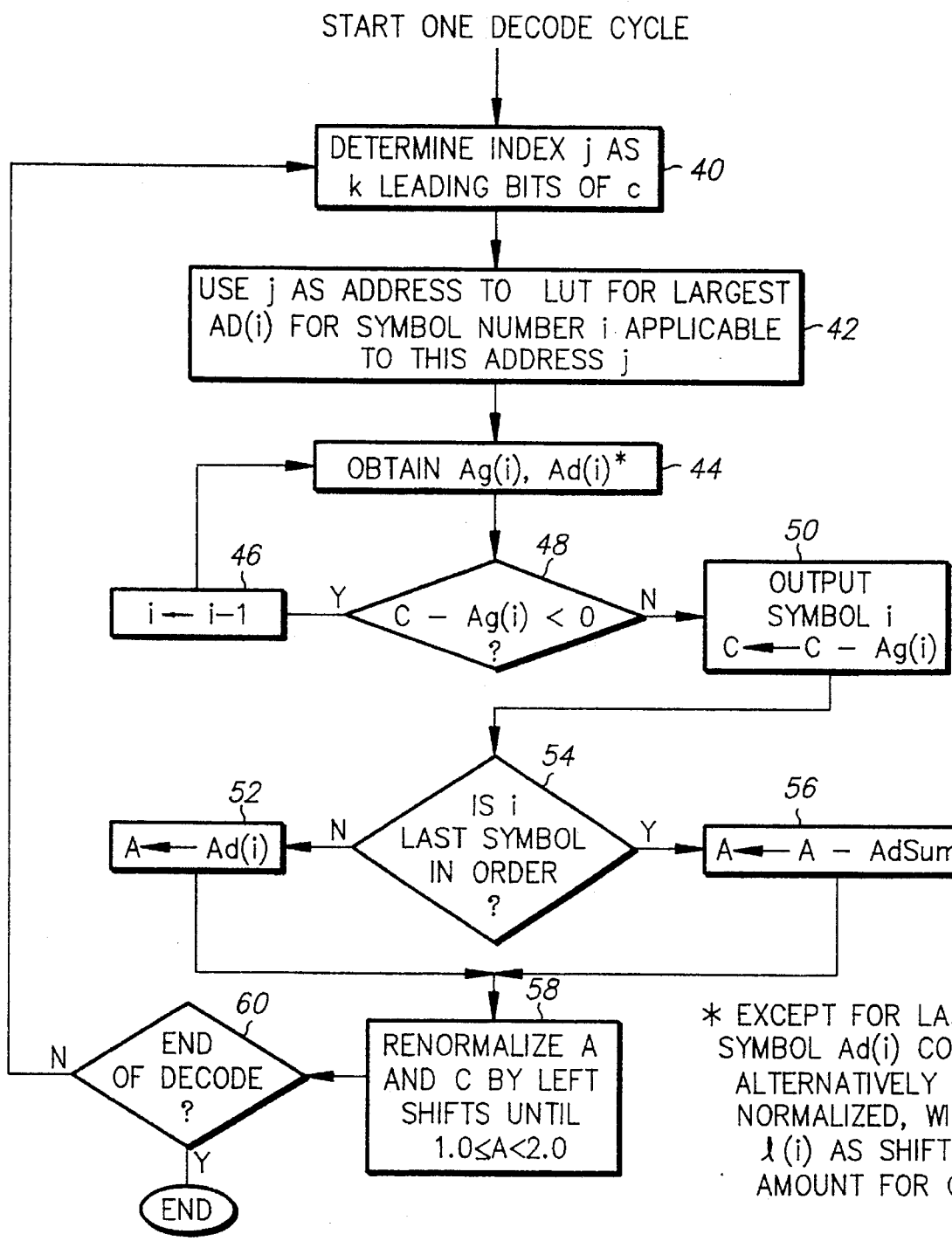
FIG. 6 depicts a flow chart for the decoding process of another embodiment of the invention.

Alternatively, a secondary table approach similar to FIG. 3 for the integer length case is given in FIG. 6. In FIG. 6, steps 40 and 42 correspond with the first two steps 2 and 4 in FIG. 3.

In step 44, we also obtain the addend Ad(i), except for the last symbol, for which the addend is calculated as A−AdSum. The subtraction step is step 48. If the subtraction leaves a positive result, in step 50 the symbol i is decoded and the positive difference from the subtraction is the new value of C prior to renormalization. Otherwise, i is decremented in step 46, and the test is done again.

If the last symbol in the ordering is decoded (step 54), the new value of A, prior to renormalization, is calculated as A−AdSum (step 56). Otherwise, the looked-up value Ad(i) becomes the new value of A.

In step 58, renormalization takes place. Unless the last symbol has just been decoded, the system is then ready to decode the next symbol.

In step 48, a negative result means Ag(i) is too large, so step 46 decrements the index to access the next smaller augend value. The 44, 48, 46 loop is exited when the augend value is just small enough (but no smaller) to decode the correct symbol.

Figure 7:
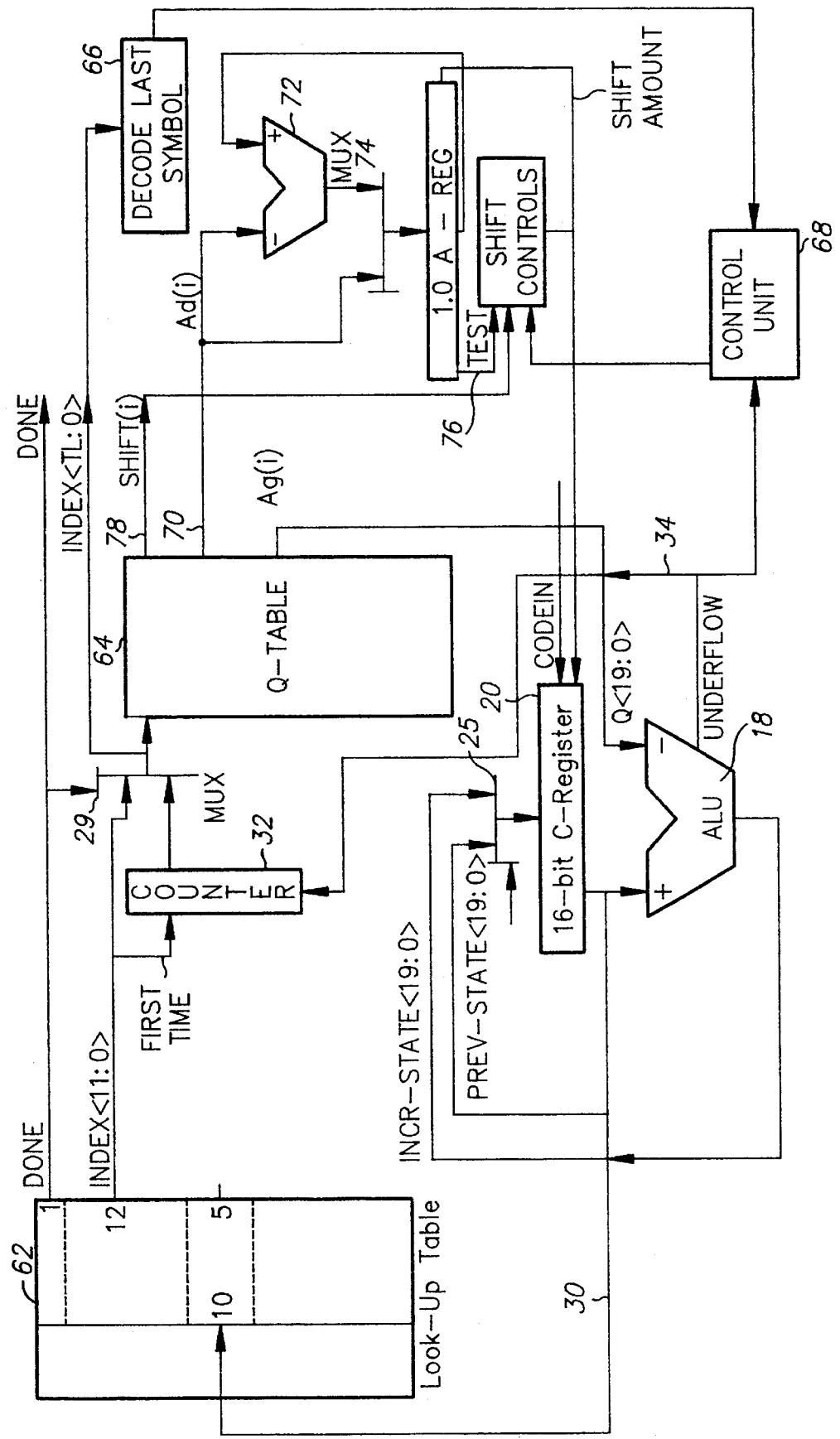
FIG. 7 depicts a decoding apparatus according to another embodiment of the invention.

FIG. 7 is a modified version of FIG. 5B, in which a lookup table 26 provides the largest possible index i that could apply to the most significant k bits in the C register. For example, if the register is 16 bits and k is 10 bits, then, for the 10-bit configuration 0.001111000, the largest possible value in C is 0.001111000111111. Hence, the index i in the table is that for which Ag(i) is less than or equal to that largest value of C. Clearly, then, Ag(i+1) must be equal to or greater than 0.001111001000000. Note that if the last symbol (largest index i) is possible, then the last symbol is the first one to be tested.

The first time an index is used, it passes through the mux 29 to address a Q-table 64 for the first trial subtraction of an augend Ag(i) through the ALU 18. If there is an underflow, then a signal 34 causes i to be decremented, and the mux 29 selects the counter value as the address for the secondary memory 64.

Suppose the LUT 62 outputs the largest index. This fact is detected by a decoder 66, which informs a control unit 68. The addend appearing on the signal 70 is actually AdSum, which must be subtracted from the A register if the decoded symbol is the last in the ordering. The ALU 72 performs the subtraction, and the mux 74 selects the difference with A to obtain the value for the A register prior to renormalization. The A register can be renormalized by left-shifting until the most significant bit position, Signal Test 76, acquires a 1 value.

If the first index (originating in the LUT 62) is not the decoded symbol, then the down-counter 32 accesses successively smaller values of Ag(i). The search ends when UNDERFLOW 34 inhibits further downcounting, and the control unit 68 allows the current index to be the decoded symbol. For symbols other than the last (treated above), the table 64 provides the new normalized value for the A register on the signal 70, and the shift amount on the signal 78 for shifting the C register.

The decoding speed resulting from any of the above search methods is comparable to what is achievable with a Huffman code having the prefix property. Combinations of the aforementioned approaches (whether for k=N or for k<N) may also yield the desirable search result.

With the A-register value varying from 1.0 to 2.0 in a base-2 system of arithmetic, the extra code space varies from 0.0 (when the A-register value is 1.0) to almost 1.0 (when the A-register value is close to 2.0). The extra code space defaults to the last symbol, which, in the case of the '856 patent, is the MPS. The coding is the most efficient if the last symbol is the most probable. However, the encoding and decoding process just described still works correctly if any symbol m is chosen to be the last symbol, so long as Ad(m) is A minus the sum of the other addends, AdSum, and AdSum<Amin, the smallest permissible value for the A register, to ensure that there is space for the MPS.

When the A-register value is close to 2.0, each encoded symbol, except for the last symbol in the arithmetic-coding order, is encoded with at worst only half of the most efficient code space. Only when the A-register value is near 1.0 does each symbol receive the code space it requires for the best coding efficiency.

Figure 8:
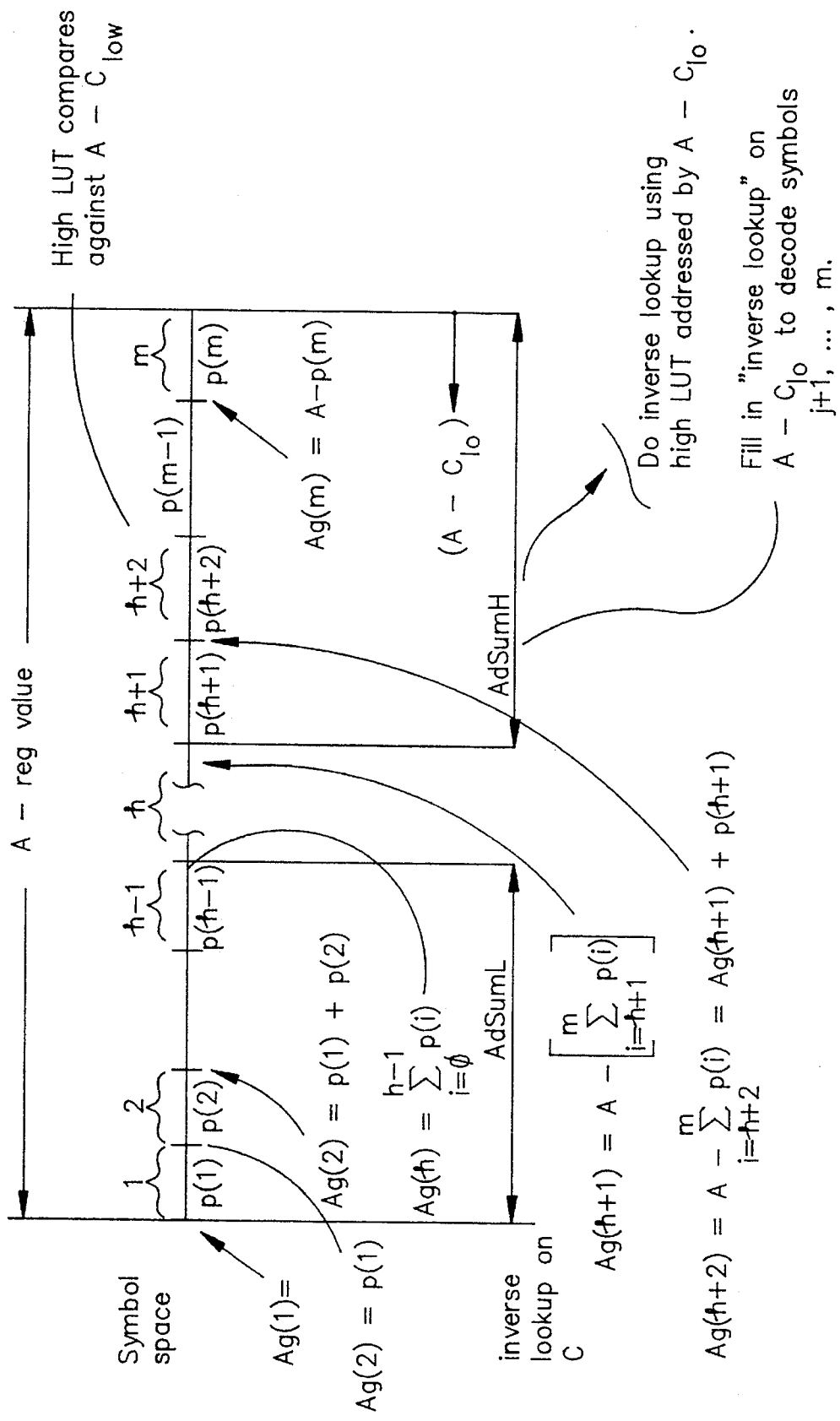
FIG. 8 depicts the allocation of codespace for a further embodiment of the invention.

In accordance with another embodiment of the present invention, the aforementioned lookup table may be extended, such that sort order can be retained while using the above-defined arithmetic coder. FIG. 8 illustrates the division of the number line for this embodiment. In preserving the sort order, it is noted that the last symbol m in the arithmetic-coding order may not always be the most probable symbol (MPS), In contrast, the last symbol in the ordering is always the most probable symbol, shown here as h. In the discussion which follows, all symbols but the MPS have preassigned addend values Ad(i), as before. The addend equivalent for the MPS depends on the current value of A, with a variation from before.

Consider again the case in which k=N. Assume a symbol h, 1<h<m, is the MPS of the m-ary alphabet. In the recursion involving the A register during either encoding or decoding, if the current symbol i is not h, the A-register will end up with Ad(i) in it, as was done in the aforementioned situations. If the extra code space c is to be given to the symbol h, any symbol from 1 to h−1 will precede h in the arithmetic-code order; these symbols are the "low" symbols relative to the MPS, with sum AdSumL=Ag(h)=

$$\sum_{i<h} *(i).$$

On the other hand, symbols:f.h+1 to m will be on the "high" side of the MPS. A second lookup table is constructed for properties relating to these "high" symbols. The total probability of the high symbols can be computed by accumulating the addend values Ad(i) in a reverse order from the last symbol m up to the symbol h+1, all of which are included in the second lookup table. The total probability of the high symbols can be computed, as $$\sum_{i>h} Ad(i) = AdSumH$$

After subtracting the total probability of the high symbols and the cumulative probabilities of the low symbols from the A-register value, the resulting value in the A register is the minimum probability assigned to h plus the extra code space c. The calculation for the current value of Ad(h) is A−AdSumH−AdSumL.

To illustrate the use of the aforementioned second lookup table, consider the recursion involving the C register during the encoding of a symbol n, where (n>h). The cumulative probability of the previous symbol is now Ag(h−1)+p(h)+c+p(h+1)+p(h+2)+ . . . +p(n−1). This calculation can conveniently be performed by working from the last symbol m. Let C(hi) be the sum of the A-register value and the C-register value, i.e., C(hi)=C+A. Thus Ag(m)=Ag(hi)−p(m), Ag(m−1)=C(hi)−(p(m)+p(m−1)), and so on. Define Ag(n) as p(m)+p(m−1)+ . . . +p(n). The above recursion for encoding h results in a new C-register value C(hi)−Ag(n), or equivalently C+(A−Ag(n)).

Finally, in the order-preserving decoding process, a symbol i, where i≦h, may be decoded in the aforementioned manner. Specifically, the decoded symbol is determined by referring to the k leading bits of the C register. For a symbol n, where n<h, the aforementioned second lookup table is used.

Figure 1:
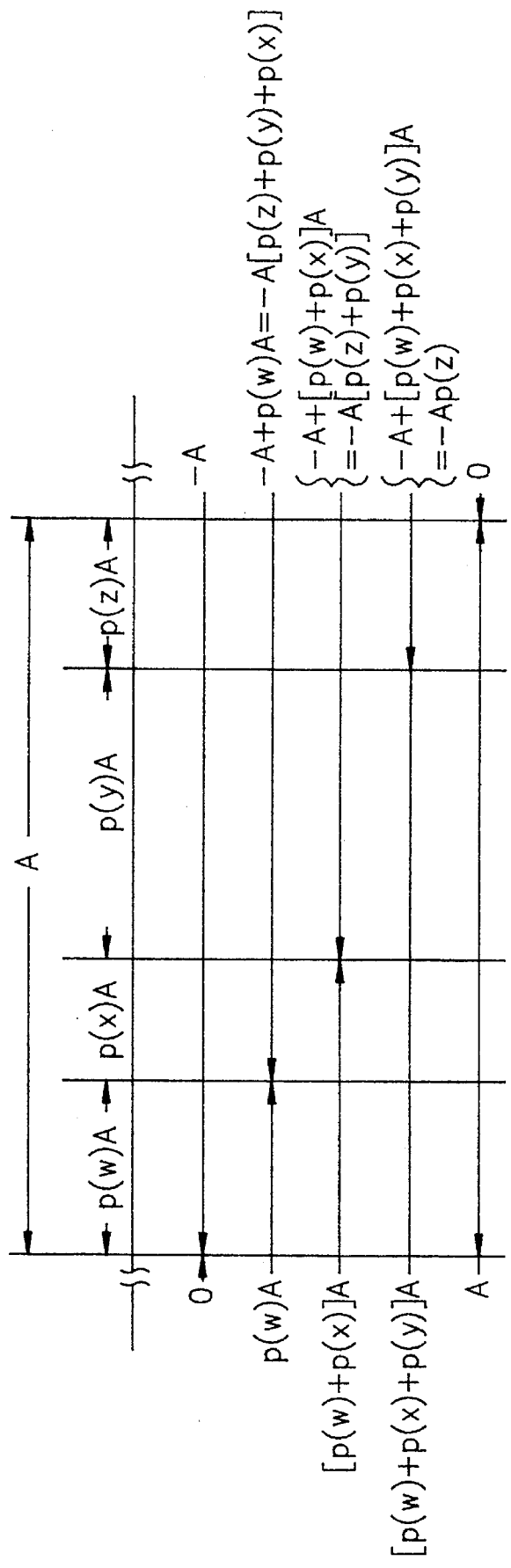
FIG. 1 depicts the subdivision of an interval width A among the four symbols of an alphabet.
Figure 2A:
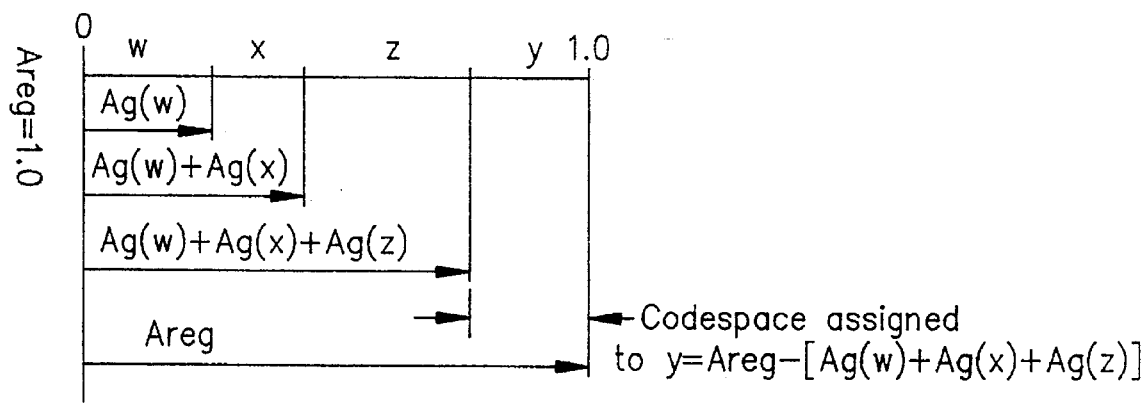
FIG. 2A depicts the allocation of codespace for a 4-symbol alphabet when A is 1.0.

To illustrate the above processes, reconsider an augend-based code for the 4-symbol example in FIG. 1, where y is the MPS. In the aforementioned prior art work by Rissanen and Mohiuddin, y is the right most symbol on the number line, as shown in FIG. 2A. In the example, we also assume the A-reg renormalization point is 1.0, and the A-reg value is contrained to the range [1.0, 2.0), i.e. closed on the :left and open on the right. Thus, instead of using the interval [0.75, 1.5), as in Rissanen and Mohiuddin, the symbol probabilities may be "scaled up" to addend values that approximate the product p(i) times A identifying the position of the new $C_{lo}$ of the interval.

In the general case, the table based on $C_{hi}$ uses value A−$C_{lo}$ in the high LUT lookup, whereas value $C_{lo}$ is used for the low LUT. In each case, an initial index is extracted for testing. For the low lookup, we search for the largest Ag(i) that can subtract from C without going negative. However, C must be less than AdSumL. The low lookup table points to the high LUT if C is less than A−AdSumH. See Table 3.1.

Similarly, the high LUT points to the low LUT for the answer if C< AdSumL, as in Table 3.2. The smaller the value of $A-C_{lo}$, the larger the decoded index. If $A-C_{lo}$ is less than the addend Ad(m) for the last symbol, the last symbol is decoded. If greater than Ad(m) but less than Ad(m)+Ad(m−1), then the symbol m−1 is decoded.

Algorithms that use IM1 typically use a range where the high bound on the interval width is a multiple of $2^k$ times the lower bound, where k is an integer greater than 1. For example, k could be 12.

Note that in FIG. 2A, there is room for the MPS code space even when A is at its minimum value 1.0. This was not always the case in the prior art '856 patent, in which the equivalent augend values must be rescaled in a complicated way. In this respect, the preferred way taught by the present invention is easier to implement than the method taught in the '856 patent, because the present variant of the method of the invention method does not require rescaling based on the A-register value to more accurately reflect the code space entitled to the non-MPS symbols.

Figure 2B:
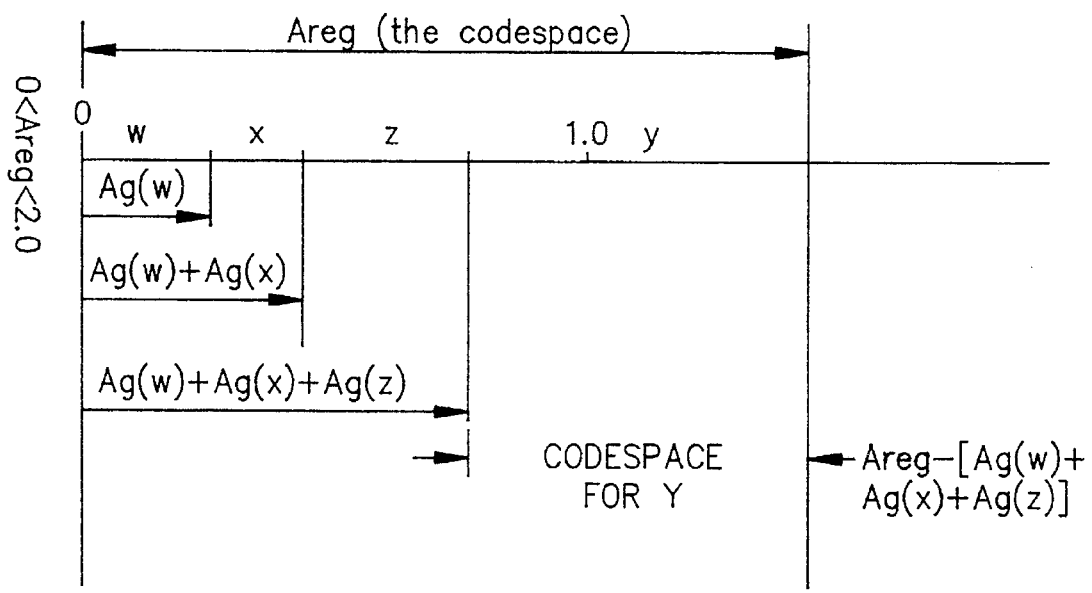
FIG. 2B depicts the allocation of codespace for a further embodiment of the invention.
Figure 2C:
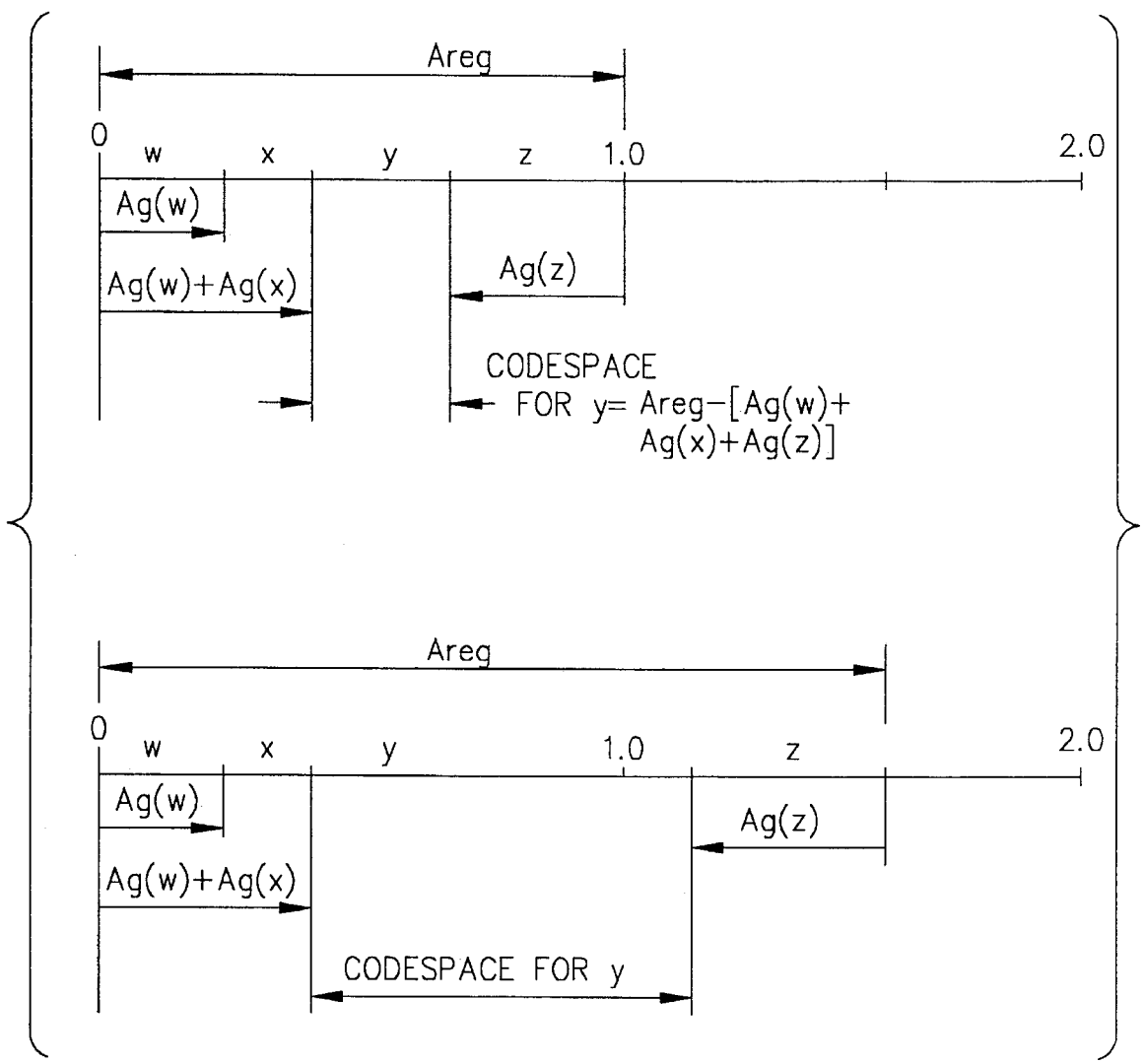
FIG. 2C depicts the allocation of codespace for a further embodiment of the invention.

To illustrate how the lexical ordering of the symbols may be maintained in the present invention, consider FIG. 2C, where the four symbols in FIG. 2A are ordered according to the lexical order in the alphabet. In FIG. 2C, the code space for y is still A−[Ag(w)+Ag(x)+Ag(z)], as in FIGS. 2A and 2B. However, identifying the code space for the MPS inward from both ends of the interval makes it unnecessary to put the MPS always at the right most position.

Given the current interval defined by $C_{lo}$, $C_{hi}$, and/or A, the new interval after encoding symbol i is shown in Table II below:

EXAMPLE 1

| Symbol | Probability p(i) Binary (decimal) | Code space Ag(i) |
|---|---|---|
| a | 0.10001 ($\frac{17}{32}$) | A − 0.10101 |
| b | 0.00010 ($\frac{2}{32}$) | 0.00011 |
| c | 0.00001 ($\frac{1}{32}$) | 0.00001 |
| d | 0.01100 ($\frac{12}{32}$) | 0.10001 |

Because a is the MPS, $C_{hi}$ is suitably chosen as the "anchor" point. The code space Ag(d) assigned to the symbol d is chosen as k×p(d), where the redistribution coefficient k is conveniently chosen to allow a redistribution of the probability mass while reserving a code space for the MPS that is not too small. Empirically, a value between 1.2 and 1.4 may be chosen for the redistribution coefficient. In this example, k is chosen to be 1.4. The code space assigned to the symbol c, ideally 1.4×p(c), is still 0.00001 because there is not enough precision to represent the additional amount. The code space for the symbol b is 1.4×p(b)≈0.00011. Note that it is not necessary to choose the same redistribution coefficient for all of the non-MPS symbols, although a single value applied to all the non-MPS symbols is preferred for implementation reasons. Finally, since the sum of Ag(d),

TABLE II

| | Encoded Symbol i | | | |
|---|---|---|---|---|
| | w | x | y | z |
| $C_{lo}$ | $C_{lo}$ | $C_{lo}$ + Ag(w) | $C_{lo}$ + Ag(w) + Ag(x) | $C_{hi}$ + Ag(z) |
| $C_{hi}$ | $C_{lo}$ + Ag(w) | $C_{lo}$ + Ag(w) + Ag(x) | $C_{hi}$ − Ag(z) | $C_{lo}$ + A |
| A | Ag(w) | Ag(x) | A − [Ag(w) + Ag(x) + Ag(z)] | Ag(z) |

As described previously, the augend values for non-MPS symbols are determined from the corresponding symbol probability. The minimum code space for the MPS exists when A=1.0, as shown in FIG. 2C.

In the present invention, it is required that the sum Ag(w)+Ag(x)+Ag(z) be less than 1.0, so that the code space assigned to y, 1.0−[Ag(w)+Ag(x)+Ag(z)], is greater than 0. This requirement is always satisfied if Ag(i)=p(i) for any non-MPS symbol i. However, the augends Ag(i) may be suitably scaled up, because the expected A-register value is typically between 1.3 and 1.5.

Ag(c) and Ag(b) is 0.10101, the code space assigned to the MPS (the symbol a) is A−0.10101.

Upon encoding of each of the four symbols a, b, c and d, the addend to the C register, the new A-register value A, and the number of shifts required to generate A are as follows:

| Symbol | Amount Added to C | New Value of A | No. of Shifts |
|---|---|---|---|
| a | 0 | (A − 0.10101) × ½ if A < 1.10101, else A − 0.10101 | 1 if A < 1.10101, else 0 |
| b | A − 0.10101 | 1.10000 | 4 |
| c | A − 0.10101) + 0.00011 | 1.00000 | 5 |
| d | A − 0.10101) + 0.00011 + 0.00001 | 1.00010 | 1 |

To further illustrate the encoding process of the above augend-based arithmetic code, consider the following examples 1 and 2.

Note that the new A-register value after encoding a non-MPS symbol i, where i=b, c, d, is Ag(i) shifted by an amount such that 1≦A<2.

EXAMPLE 2

Consider a new ordering of symbols b, a, d and c, each having the same corresponding probability as the symbols in Example 1. That is,

| Symbol | Probability p(i) | Code space Ag(i) |
|---|---|---|
| b | 0.00010 | 0.00011 |
| a | 0.10001 | A − 0.10101 |
| d | 0.01100 | 0.10001 |
| c | 0.00001 | 0.00001 |

Upon encoding of each of the four symbols a, b, c and d, the addend to the C register, the new A-register value A, and the number of shifts required to generate A are as follows:

| Symbol | Amount Added to C | New Value of A | No. of Shifts |
|---|---|---|---|
| b | 0 | 1.10000 | 4 |
| a | 0.00011 | (A − 0.10101) × ½ if A < 1.10101, else A − 0.10101 | 1 if A < 1.10101, else 0 |
| d | (A − 0.10101) + 0.00011 | 1.00010 | 1 |
| c | (A − 0.10101) + 0.00011 + 0.10001 | 1.00000 | 5 |

Again, the new A-register value after encoding a non-MPS symbol i, where i=b, c, d, is Ag(i) shifted by an amount such that $1 \leq A < 2$.

Likewise, to further illustrate the decoding process of the augend-based arithmetic code of the present invention, consider the following examples 3 and 4.

EXAMPLE 3

Consider the following 4-symbol alphabet:

| Symbol | Probability p(i) | Code space Ag(i) |
|---|---|---|
| e | 0.04 | 0.05 |
| f | 0.24 | 0.30 |
| g | 0.57 | A − 0.54 |
| h | 0.15 | 0.19 |

The code space Ag(i) assigned to the non-MPS symbols is obtained by "scaling up" the symbol probability by the redistribution coefficient k. In this example, k is 1.25. The code space for the MPS, Ag(g), has a minimum value of 0.46 and is always less than 1.46.

Because the MPS is not at either end of the lexical order, neither $C_{lo}$ nor $C_{hi}$ may be used as an "anchor" point. As a result, two decoding tables are needed. Symbols on the left of the MPS in the lexical order are decoded by Table 3.1, whereas symbols on the right of the MPS in the lexical order are decoded by Table 3.2.

TABLE 3.1

| Decoding of symbol i | | |
|---|---|---|
| If not symbol i −1, and if | Found Out by Table | Then decode symbol i |
| $0 \leq C < 0.05 = Ag(f)$ | 3.1 | e |
| $0.5 \leq C < 0.35 = Ag(g)$ | 3.1 | f |
| $C < A − 0.19 = A\text{-AdSumH}$ | 3.2 | g or h (upper LUT) |
| $C \geq A − 0.19$ | 3.2 | g |

TABLE 3.2

| Decoding of symbol i | | |
|---|---|---|
| If not symbol i −1, and if | Found Out by Table | Then decode symbol i |
| $A − C_{lo} \leq 0.19 = \text{AdSumH}$ | 3.2 | h |
| $A − C_{lo} > 0.19$ | 3.2 | g |
| if $C \geq 0.35 = \text{AdSumL}$ | | g or h |
| if $C < 0.35$ | | use lower LUT |

From Table 3.1, C-register values that are greater than or equal to zero, but less than 0.05 (i.e., Ag(e)), would decode to the symbol e. C-register values equal to or greater than 0.05, but less than 0.35 (i.e., Ag(e)+Ag(f)), would decode to the symbol f. Note that in a full precision lookup table, there will be an address equal to 0.05. In a non-full precision lookup, there will be an address that include (but not equal to) 0.05.

In the latter circumstance, the contents at that address will flag the multiplier augend case as well as the need of a further operation (or operations) to perform the decoding process.

If the C-register value is equal to or greater than 0.35, the A-register value must also be examined. If the C-register value is greater than the A-register value subtracting 0.19 (i.e., Ag(h)), then the decode entry would be uniquely determined to be g. However, if C is less than A−0.19, the decode symbol could be either g or h. In this respect, Table 3.2 must be consulted to determine the decode entry.

Once the above symbol i is decoded, the new values for the C and A registers are calculated as follows:

| Decode Symbol i | New C | New A | Number of Shifts |
|---|---|---|---|
| e | $C_{old} \ll 5$ | 1.6 | 5 |
| f | $(C_{old} − 0.05) \ll 2$ | 1.2 | 2 |
| g | $(C_{old} − 0.35) \ll 0$ or 1 | $(A − 0.53) \ll 0$ or 1 | 1 if A − 0.53 < 1 else 0 |
| h | $(C_{old} + A − 0.15) \ll 3$ | 1.52 | 3 |

Finally, it is noted that the probability of the least probable symbol will determine the smallest augend value, and this value (in binary) may be adjusted upward to reduce the number of bits of address needed for decoding.

EXAMPLE 4

Consider the following five symbols in lexical order with probabilities and augend values expressed in 5-bit precision:

| Symbol | Binary Probability | Augend | Cum |
|---|---|---|---|
| l | 0.00001 | 0.0001 | 0 |
| m | 0.00111 | 0.0100 | 0.0001 |
| n | 0.01110 | A – 0.1011 | 0.0101 |
| p | 0.00100 | 0.0010 | –0.0110 |
| q | 0.00110 | 0.0100 | –0.0100 |

The smallest code space for the symbol n (the MPS) is 0.0101, since the minimum value of A is 1.0000. The augend values of the non-MPS symbols (l, m, p and q) are scaled up from the respective probabilities such that the 5-bit precision is no longer needed for the augend values. This has the advantage of reducing the size of the lookup memory by half. The last two values in the last column, i.e., Cum(p) and Cum(q), are negative because they represent values subtracted from the codestring during decoding of symbols to the right of the MPS in the lexical order, namely p and q.

Since the MPS is not at either end of the lexical order, two decode tables, 4.1 and 4.2, each in 4-bit precision, are needed for decoding:

TABLE 4.1

| C | Decode Entry |
|---|---|
| 0.0000 | l |
| 0.0001 | m |
| 0.0010 | m |
| 0.0011 | m |
| 0.0100 | m |
| 0.0101 | n |
| 0.0110 | n |
| 0.0111 | n |
| 0.1000 | n |
| 0.1001 | n |
| 0.1010 | n or p |
| 0.1011 | n or p |
| 0.1100 | n or p or q |
| . . . | | see Table 4.2

TABLE 4.2

| A – C | Decode Entry |
|---|---|
| 0.0000 | Decode Error (A – C ≦ 0 not possible) |
| 0.0001 | q |
| 0.0010 | q |
| 0.0011 | q |
| 0.0100 | q |
| 0.0101 | p |
| 0.0110 | p |
| 0.0111 | n |
| 0.1000 | n |
| 0.1001 | n |
| 0.1010 | n |
| 0.1011 | n |

TABLE 4.2-continued

| A – C | Decode Entry |
|---|---|
| 0.1100 | n or m |
| . . . | n or m |
| 1.1000 | n or m |
| 1.1001 | m |
| . . . | | see also Table 4.1

The use of the above decode tables is exemplified as follows. Suppose C=0.1101 and A=1.1100. The value of A–C is 0.1111. Decode Table 4.1 indicates that one of n, p or q (?) at entry 1.0000 (?) would be the decoded symbol. On the other hand, Decode Table 4.2 indicates that either m or n would be the decoded symbol. Hence the decoded symbol must be n because it is the only symbol that satisfies both decode tables.

After the decoding of the symbol n, the new C-register value is 0.1101–0.0101 and the new A-register value is the old A subtracting 0.1011, or 1.0001.

Suppose C=0.1101 and A=1.0000 and A–C is 0.0011. Table 4.1 gives "n or p or q", whereas a Table 4.2 address at 0.0011 gives q. Therefore the decode symbol is q.

Suppose C=0.1001 and A=1.0000 (an extreme case used to generate the table). In Decode Table 4.1, 0.1001 is the last value for decoding n. This occurs when A=1.000, in which case an address in Decode Table 4.2 at 0.0111 points to the first value in that table to decode n. It is also noted that, because the minimum code space allocated to n is 0.0101, there exist five corresponding addresses in each 4-bit precision lookup table.

Finally, suppose C is 0.0101 and A is 1.1111 (i.e., at its maximum). A–C is 1.1010, indicating a decode symbol of either n or m in Table 4.2. Note that values are subtracted from A, rather than added to it, when A is greater than 1.0. As a result, A becomes greater than 1.0000 only by left-shifting. Conventionally, one 0 is left-shifted. For this entry, if A is less than 1.1111, C is less than 0.0101. Table 1 will uniquely determine what the decode symbol is.

A software implementation of a decoding method in accordance with the invention, is provided as an APPENDIX to the present disclosure.

While the invention is primarily disclosed as a method, it will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention. Also, an article of manufacture, such as a pro-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

APPENDIX

This is an algorithm based on fixed statistics on the symbols. The algorithm first identifies the MPS(most probable symbol) and then calculates the array fcum for the 256 symbols as follows: fcum(N) = prob(0)+prob(1)+...+prob(N-1)   if N <= MPS fcum(N) = prob(N)+prob(N+1)+...+prob(256)   if N > MPS where prob(N) is the probability of the Nth symbol scaled between 1 and 32767. There are two look-up tables right_dex and left_dex each 1K long. The right_dex takes the first 10 bits of the difference A - C where A is the A-register and C is the C-register and points to the largest N > MPS that satisfies fcum(N) >= A - C. If there is such an N then right_crash indicates if there is a possibility of more than one. In case that right_dex fails to decode the symbol left_dex will point to the largest N <= MPS such that fcum(N) <= C. Again left_carsh indicates whether there is a possibility of multiple solution and if so a linear search is performed.

chars is the number of characters processed. cycle_cnt is the number of subtractions before the symbol is decoded. Hence for example if any of the right_dex or left_dex succeed in finding the symbol without a crash the there is only one subtraction performed. We take the number of subtractions as a unit of a cycle.

```
right_dex:       array(.0..1023.) of integer;
left_dex:        array(.0..1023.) of integer;
right_crash:     array(.0..1023.) of boolean;
left_crash:      array(.0..1023.) of boolean;
cycle_cnt:       integer;
chars:           integer;
```

(*********************************************************)

This procedure initializes the right_dex, left_dex, right_crash and left_crash.
In each case given the first 10 bits of a register
points to
a possible solution using the maximum register value. Then using
the minimum register value checks if there is a possibility of
multiple solution. In such a case the flag "crash" is set to true.

```
procedure initializeproc;
 var
   i, j, N:    integer;
 begin for i:= 0 to 1023 do begin
   right_crash(.i.):= false;
   left_crash(.i.):= false;
 end;
 for i:= 0 to 1023 do begin
   N:= 255;
   while ( N > MPS) and (fcum(.N.) < i * 64 ) do
     N:= N - 1;
   right_dex(.i.):= N;
   if (N > MPS) and (fcum(.N.) < i * 64 + 63) then
     right_crash(.i.):= true;
 end;
 for i:= 0 to 1023 do begin
   N:= MPS;
   while fcum(.N.) > i * 64 + 63 do
     N:= N - 1;
   left_dex(.i.):= N;
   if fcum(.N.) > i * 64 then
     left_crash(.i.):= true;
 end;

(*******************************************************)

fdecproc from the first 10 bits of "A - C" first uses the
right_dex to find the symbol. If the answer is found then
right_crash tells us if there is a need for search.
In the case that right_dec points to the MPS that indicates
that the solution is <= to the MPS. The left_dex is then
employed and left_crash indicates if there is a need for
a search.
Notice that in a hardware implementation right and left
can be used in parallel and left_dex does not need to wait
for the answer of the right_dex.

procedure fdecproc;

var
   N,M, i:     integer;
   fini:      boolean;
```

```
begin
  fini:= false;
  if a < c then begin
    N:= 255;
    fini:= true;
  end
  else begin
    i:= (a - c) div 64;
    N:= right_hash(.i.);
    if N > MPS then
      if not(right_crash(.i.)) then
        fini:= true
      else begin
        while ( N > MPS) and (a - c > fcum(.N.)) do begin
          N:= N - 1;
          cycle_cnt:= cycle_cnt + 1;
        end;
        if N > MPS then
          fini:= true;
      end;
  end;
  if not(fini) then begin
    i:= c div 64;
    N:= left_hash(.i.);
      if left_crash(.i.) then
        while c < fcum(.N.) do begin
          N:= N - 1;
          cycle_cnt:= cycle_cnt + 1;
        end;
  end;

if N > MPS then
    c:= c - a + fcum(.N.)
  else
    c:= c - fcum(.N.);
  if N <> MPS then
    a:= fprob(.N.)
  else
    a:= a - fcum(.N.) - fcum(.N+1.);
  if a < renormval then
    derenormproc;

write(outfile9, chr(N));
  treepointer:= N + 2;

end;
```

(*******************************************************************)

What is claimed is:

1. An apparatus for coding and decoding symbols of an alphabet, the alphabet having a predetermined order for the symbols, the apparatus comprising:

an augend table containing, for each respective symbol, a respective augend having a value related to a cumulative probability of all symbols of the alphabet which precede the respective symbol in the predetermined order, the cumulative probability being based on approximations, to negative powers of 2, of probabilities of the symbols of the alphabet which precede the respective symbol;

means for encoding a symbol, the means for encoding including:
(i) means for producing a numerical representation of the symbol,
(ii) means for adding the numerical representation to the augend whose value is related to the cumulative probability of the symbols which precede the symbol to be encoded, to produce a sum, and
(iii) means for left-shifting the sum to renormalize; and means for decoding a symbol from a code string, the means for decoding including:
(i) means for identifying a coded symbol from at least one most significant bit of the code string,
(ii) means for determining which of the augends of the augend table was added to the symbol to produce the coded symbol, and
(iii) means for obtaining the decoded symbol from the code string by means of the augend determined by the means for determining.

2. An apparatus as recited in claim 1 wherein the means for decoding includes means for obtaining the decoded symbol from the identified coded symbol by identifying the largest cumulative probability whose value is less than that of the coded symbol.

3. An apparatus as recited in claim 1, wherein the means for decoding includes an inverse table containing respective decoded symbols which are addressable by respective index values which correspond with coded symbols of the alphabet.

4. A method for coding and decoding symbols of an alphabet, the alphabet having a predetermined order for the symbols, the method being for use with a coding and processing system including an augend table containing, for each respective symbol, a respective augend having a value related to a cumulative probability of all symbols of the alphabet which precede the respective symbol in the predetermined order, the cumulative probability being based on approximations, to negative powers of 2, of probabilities of the symbols of the alphabet which precede the respective symbol; the method comprising the steps of:

encoding a symbol by:
(i) producing a numerical representation of the symbol,
(ii) adding the numerical representation to the augend whose value is related to the cumulative probability of the symbols which precede the symbol to be encoded, to produce a sum, and
(iii) left-shifting the sum to renormalize; and decoding a symbol from a code string by:
(i) identifying a coded symbol from at least one most significant bit of the code string,
(ii) determining which of the augends of the augend table was added to the symbol to produce the coded symbol, and
(iii) obtaining the decoded symbol frown the code string by means of the augend determined in the step of determining.

5. A method as recited in claim 4 wherein the step of decoding includes obtaining the decoded symbol from the identified coded symbol by identifying the largest cumulative probability whose value is less than that of the coded symbol.

6. A method as recited in claim 4, wherein the step of decoding includes identifying a coded symbol using an inverse table containing respective decoded symbols which are addressable by respective index values which correspond with coded symbols of the alphabet.

7. A computer program product for coding and decoding symbols of an alphabet, the alphabet having a predetermined order for the symbols, the computer program product being for use with a coding and processing system, the computer program product comprising:

a computer-readable recording medium;

means, recorded on the recording medium, for directing the coding and processing system to maintain an augend table containing, for each respective symbol, a respective augend having a value related to a cumulative probability of all symbols of the alphabet which precede the respective symbol in the predetermined order, the cumulative probability being based on approximations, to negative powers of 2, of probabilities of the symbols of the alphabet which precede the respective symbol;

means, recorded on the recording medium, for directing the coding and processing system to encode a symbol by performing the steps of:
(i) producing a numerical representation of the symbol,
(ii) adding the numerical representation to the augend whose value is related to the cumulative probability of the symbols which precede the symbol to be encoded, to produce a sum, and
(iii) left-shifting the sum to renormalize; and means, recorded on the recording medium, for directing the coding and processing system to decode a symbol from a code string by performing the steps of:
(i) identifying a coded symbol from at least one most significant bit of the code string,
(ii) determining which of the augends of the augend table was added to the symbol to produce the coded symbol, and
(iii) obtaining the decoded symbol from the code string by means of the augend determined by the step of determining.

8. A computer program product as recited in claim 7 wherein the means for directing to decode includes means, recorded on the recording medium, for directing the coding and processing system to obtain the decoded symbol from the identified coded symbol by identifying the largest cumulative probability whose value is less than that of the coded symbol.

9. A computer program product as recited in claim 7, wherein the means for directing to decode includes means, recorded on the recording medium, for directing the coding and processing system to maintain an inverse table containing respective decoded symbols which are addressable by respective index values which correspond with coded symbols of the alphabet.

* * * * *

UNITED STATES PATENT AND TRADEMARK OFFICE
CERTIFICATE OF CORRECTION

PATENT NO. : 5,546,080
DATED : Aug. 13, 1996
INVENTOR(S) : Glen G. Langdon, Jr. and Ahmad Zandi It is certified that error appears in the above-indentified patent and that said Letters Patent is hereby corrected as shown below:

Front Page, please change the title from

"ORDER-PRESERVING, FAST-DECODING ARITHMETIC CODING ARITHMETIC CODING AND COMPRESSION METHOD AND APPARATUS"

to

--ORDER-PRESERVING, FAST-DECODING ARITHMETIC CODING AND COMPRESSION METHOD AND APPARATUS--

Front Page, please correct the spelling of the attorney name from "Pinter" to --Pintner--.

Column 1, lines 1-4, change title from

"ORDER-PRESERVING, FAST-DECODING ARITHMETIC CODING ARITHMETIC CODING AND COMPRESSION METHOD AND APPARATUS"

to

--ORDER-PRESERVING, FAST-DECODING ARITHMETIC CODING AND COMPRESSION METHOD AND APPARATUS--

Column 14, line 13, please change the mathematical expression from $$-- \sum_{i<h} Ad(i) \quad --$$

to $$" \sum_{i<h} \blacksquare (i) \quad "$$

UNITED STATES PATENT AND TRADEMARK OFFICE
CERTIFICATE OF CORRECTION

PATENT NO.   : 5,546,080
DATED        : Aug. 13, 1996
INVENTOR(S)  : Glen G. Langdon, Jr. and Ahmad Zandi It is certified that error appears in the above-indentified patent and that said Letters Patent is hereby corrected as shown below:

Column 14, line 16, change "symbols:f.h+1" to  --symbols h+1--.

Signed and Sealed this

Tenth Day of June, 1997

*Attest:*

BRUCE LEHMAN

*Attesting Officer*          *Commissioner of Patents and Trademarks*